(12) United States Patent
Brunn et al.

(10) Patent No.: US 7,505,541 B1
(45) Date of Patent: Mar. 17, 2009

(54) NRZ/PAM-4/PRML TRIPLE MODE PHASE AND DATA DETECTOR

(75) Inventors: Brian T. Brunn, Austin, TX (US); Firas N. Abughazaleh, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 666 days.

(21) Appl. No.: 11/099,865

(22) Filed: Apr. 5, 2005

Related U.S. Application Data

(63) Continuation-in-part of application No. 11/059,739, filed on Feb. 17, 2005, now Pat. No. 7,184,511, which is a continuation-in-part of application No. 10/421,247, filed on Apr. 22, 2003, now Pat. No. 6,956,923, which is a continuation-in-part of application No. 10/346,435, filed on Jan. 17, 2003, now Pat. No. 6,977,959.

(51) Int. Cl.
 *H04L 7/02* (2006.01)
 *H03D 3/24* (2006.01)
(52) U.S. Cl. ........................ 375/360; 375/376
(58) Field of Classification Search ................. 375/354, 375/360, 359, 361, 371–377, 290, 286, 291, 375/259; 327/141, 144, 146, 155, 159
See application file for complete search history.

(56) References Cited

U.S. PATENT DOCUMENTS

| | | | | |
|---|---|---|---|---|
| 5,248,969 A | * | 9/1993 | Lee et al. ...................... | 341/73 |
| 5,329,559 A | | 7/1994 | Wong et al. | |
| 5,483,558 A | | 1/1996 | Leon et al. | |
| 6,034,554 A | * | 3/2000 | Francis et al. .................. | 327/7 |
| 6,225,831 B1 | * | 5/2001 | Dalmia et al. .................. | 327/12 |
| 6,356,160 B1 | * | 3/2002 | Robinson et al. .............. | 331/17 |
| 6,590,949 B1 | | 7/2003 | Marten et al. | |
| 6,686,777 B1 | * | 2/2004 | Karlquist ...................... | 327/2 |
| 6,732,349 B1 | | 5/2004 | Sun et al. | |

(Continued)

FOREIGN PATENT DOCUMENTS

EP     1599943 B1     3/2008

OTHER PUBLICATIONS

U.S. Appl. No. 10/346,435, filed Jan. 17, 2003, Brunn et al.

(Continued)

*Primary Examiner*—Tesfaldet Bocure
(74) *Attorney, Agent, or Firm*—James Harrison

(57) ABSTRACT

The multi-mode phase and data detector includes a phase detector and a charge pump. A plurality of latching blocks clocked on complimentary phases of a feedback signal produces a plurality of phase and transition signals. Based on a selectable bias level, latched comparators in the latching blocks operate to detect the multi-level input data signal as it crosses a plurality of threshold levels. Logic within the multi-mode phase and data detector selects subsets of exclusive OR gates from sets of exclusive OR gates and subsets of the latching comparators to place the multi-mode phase and data detector in one of a PAM-4, NRZ, or PRML mode of operation. The logic further selects subsets of latched comparators from the plurality of parallel coupled latches to further define the mode of operation of the multi-mode phase and data detector.

18 Claims, 18 Drawing Sheets

U.S. PATENT DOCUMENTS

| | | | |
|---|---|---|---|
| 6,771,728 B1 * | 8/2004 | Abernathy | 375/371 |
| 7,346,794 B1 | 3/2008 | Davidson et al. | |
| 2002/0021470 A1 * | 2/2002 | Savoj | 359/158 |
| 2003/0001557 A1 * | 1/2003 | Pisipaty | 324/76.53 |

OTHER PUBLICATIONS

U.S. Appl. No. 10/421,247, filed Apr. 22, 2003, Younis et al.

U.S. Appl. No. 11/059,739, filed Feb. 17, 2005, Younis et al.

Savoj, Jafar et al., "A 10-Gb/s CMOS Clock and Data Recovery Circuit with a Half-Rate Linear Phase Detector," *IEEE Journal of Solid State Circuits*, May 2001, pp. 761-767, vol. 36, No. 5.

Savoj, Jafar et al., "A 10-Gb/s CMOS Clock and Data Recovery Circuit," *2000 Symposium on VLSI Circuits Digest of Technical Papers*, Jun. 13-15, 2000, pp. 136-139, Honolulu, Hawaii, USA.

Alexander, J.D.H., "Clock Recovery from Random Binary Signals," reprinted from *Electronic Letters*, Oct. 1975, vol. 11, pp. 541-542, pp. 242-243 reprint.

Savoj, Jafar et al., "A 10-Gb/s CMOS Clock and Data Recovery Circuit with Frequency Detection," *International Solid State Circuits Conference, Technical Digest*, Feb. 5-7, 2001, pp. 433-435, San Francisco, California, USA.

Savoj, Jafar et al., "Design of Half-Rate Clock and Data Recovery Circuits for Optical Communication Systems," *Proceedings of the 38th Annual Design Automation Conference*, Jun. 18-22, 2001, pp. 121-126, Las Vegas, Nevada, USA.

Hogge, Charles R., "A Self Correcting Clock Recovery Circuit," *IEEE Journal of Lightwave Technology*, Dec. 1985, vol. LT-3, pp. 249-251.

Savoj, Jafar et al., "A 10-Gb/s CMOS Clock and Data Recovery Circuit with a Haf-Rate Binary Phase Detector," *IEEE Journal of Solid-State Circuits*, Jan. 2003, pp. 13-21, vol. 38, No. 15.

Seedher, Ankit et al., "Fractional Rate Phase Detectors for Clock and Data Recovery," *Proceedings of the 2003 IEEE International SOC Conference*, Sep. 17-20, 2003, pp. 313-316.

* cited by examiner clock recovery circuit 10 phase detector 14 phase detector timing diagrams charge pump 16

Superposition circuitry first signal component sinks current

Superposition circuitry second signal component sources current

Superposition circuitry third signal component sources current

Superposition circuitry fourth signal component provides zero current transceiver 100 receiver clocking module 102

FIG. 11 transceiver 100

PAM-4 phase detector charge pump

PAM-4 transitions

NRZ mode

PRML phase detector with decoder

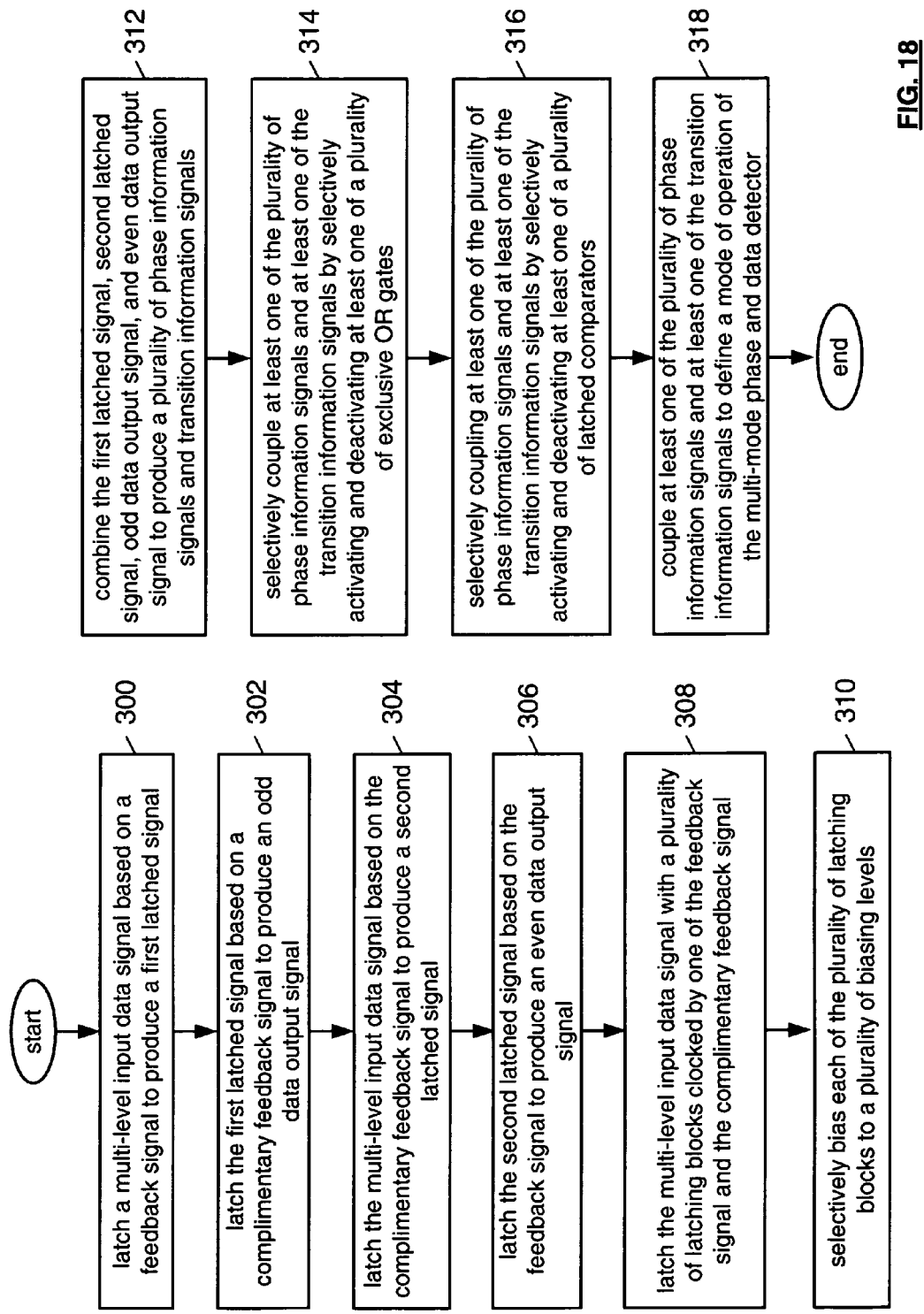

NRZ/PAM-4/PRML TRIPLE MODE PHASE AND DATA DETECTOR

CROSS-REFERENCE TO RELATED APPLICATIONS

This application is a continuation-in-part of commonly assigned, U.S. patent application Ser. No. 10/346,435, filed Jan. 17, 2003, titled "Clock and Data Recovery Phase-Locked Loop", now issued as U.S. Pat. No. 6,977,959 on Dec. 29, 2005, by Brian T. Brunn, et. al., Ser. No. 10/421,247, filed Apr. 22, 2003, titled "High Speed Phase Detector Architecture", now issued as U.S. Pat. No. 6,956,923 on Oct. 28, 2005, by Ahmed Younis, et. al., and Ser. No. 11/059,739, filed Feb. 17, 2005, titled "A Method and Apparatus for Data-Density-Independent Phase Adjustment in a Clock and Data Recovery System", now issued as U.S. Pat. No. 7,184,511 on Feb. 27, 2007, by Ahmed Younis, et. al.; all three of the above mention applications are herein incorporated by reference in their entirety.

BACKGROUND OF THE INVENTION

1. Technical Field of the Invention

This invention relates generally to communication systems and more particularly to phase detectors used therein.

2. Description of Related Art

Communication systems are known to transport large amounts of data between a plurality of end user devices, which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, requires 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information. Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for the feedback loop to operate correctly. Some prior art designs are bandwidth limited.

As the demand for data throughput increases, so do the demands on a high-speed serial transceiver. Modulation rates may be increased to increase the data throughput for a given clock speed at the expense of greater complexity. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for wide spread use.

What is needed, therefore, is an apparatus that can receive high-speed serial transmissions in a variety of modulation modes, extract the information, and provide the extracted serial data to parallel devices at data rates that ensure data integrity and can be obtained with cost-conscious technology.

BRIEF SUMMARY OF THE INVENTION

The described embodiments of the present invention substantially solve the previously described problems. A multi-mode phase and data detector in accordance with an exemplary embodiment of the present invention includes a phase detector and a charge pump operably coupled to detect a plurality of modulated signals. A plurality of transparent latching blocks and plurality of latching blocks clocked on complimentary phases of a feedback signal produces a plurality of phase and transition signals responsive to a multi-level input data signal.

In one embodiment of the invention each of the plurality of latching blocks includes a plurality of latching comparators coupled in parallel, each biased at a plurality of selectable bias levels. Complimentary pairs of latching comparators are biased with different threshold values. By biasing pairs of latching comparators at the different bias level, the present invention detects the multi-level input data signal crossing a plurality of threshold levels.

In an embodiment of the invention logic within the multi-mode phase and data detector selects subsets of exclusive OR gates from sets of exclusive OR gates and subsets of the latching comparators to place the multi-mode phase and data detector in one of a pulse amplitude modulated-4 (PAM)-4, non-return-to-zero (NRZ), or partial response maximum likelihood (PRML) coding/modulation schemes or modes of operation. The logic further selects subsets of latched comparators from the plurality of parallel coupled latches to further define the mode of operation of the multi-mode phase and data detector.

The methods and apparatus of embodiments of the present invention produce a plurality of phase and transition information pulses. The complimentary design of the phase and transition information produces complimentary pulses that are, relative to the center of a bit period, representative of both early and late samples. These pulses will be early and late by the same amount thereby producing, on average, a pulse that is substantially centered in the middle of the bit period.

In one aspect of the invention the charge pump includes a plurality of parallel coupled transconductance amplifiers for producing, as an error signal, current to or extracting current from a downstream loop filter. As is known to one of average skill in the art, the loop filter produces a control voltage from the error signal to control the oscillation of a voltage controlled oscillation module.

BRIEF DESCRIPTION OF THE DRAWINGS

FIG. 18 is a flow chart of a method according to one embodiment of the present invention.

DETAILED DESCRIPTION OF THE INVENTION

Figure 1:
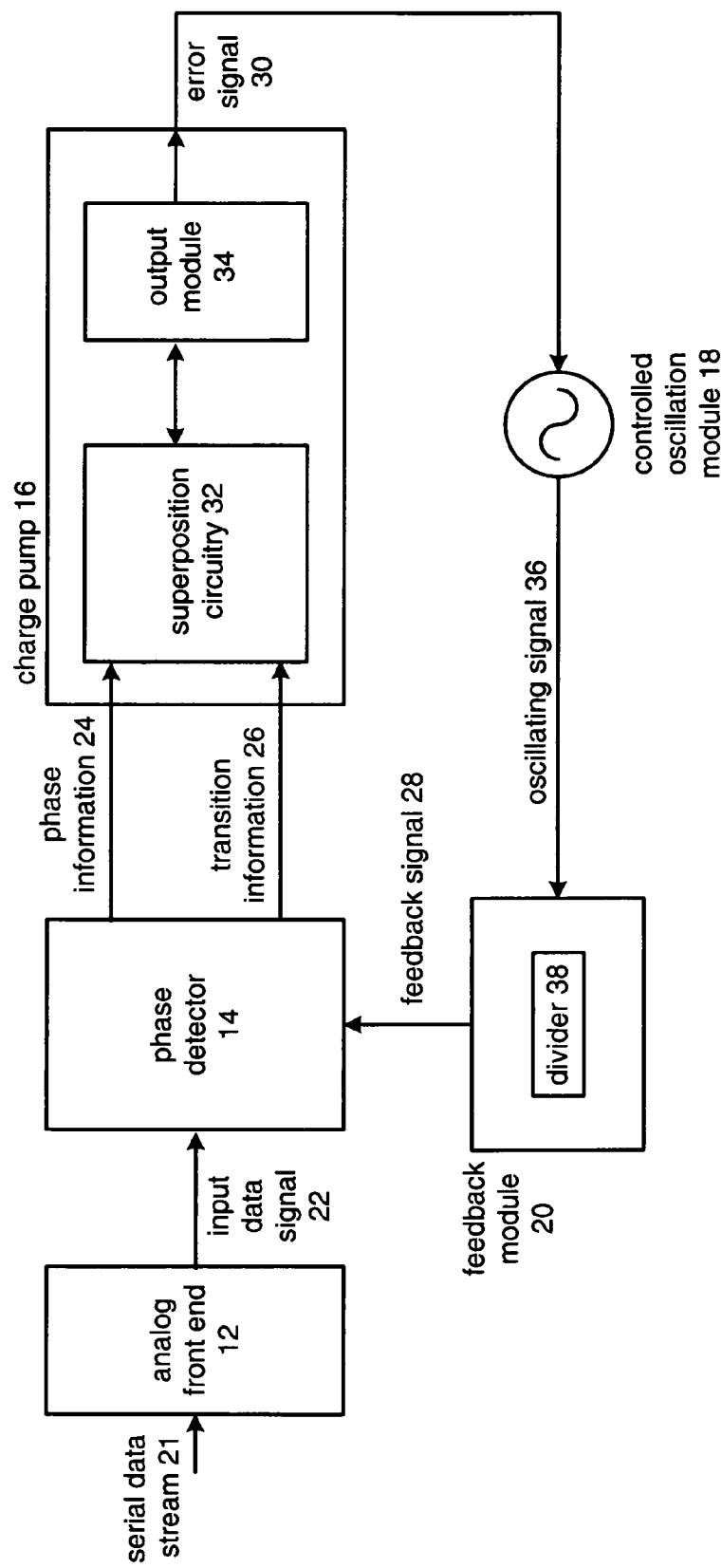
FIG. 1 illustrates a block diagram of a clock recovery circuit in accordance with an embodiment of the present invention.

FIG. 1 illustrates a block diagram of a clock and/or data recovery circuit 10 in accordance with the preferred embodiment of the present invention. The clock recovery circuit 10 includes an analog front end 12, a phase detector 14, a charge pump 16, a controlled oscillation module 18, and a feedback module 20. Charge pump 16 includes superposition circuitry 32 and an output module 34.

Analog front end 12 receives a serial data stream 21, which may be a high data rate bit stream transferring data at 1 or more gigabits per second. This high data rate usually results in some loss of high frequency components of the bit stream due to the limited bandwidth of the input line. Analog front end 12 provides amplitude equalization to produce input data signal 22. Phase detector 14 produces phase information 24 and transition information 26 based on the input data signal 22 and a feedback signal 28. Operation of phase detector 14 will be discussed in greater detail with reference to FIG. 2. Charge pump 16 produces an error signal 30 based on the phase information 24 and transition information 26. Operation of charge pump 16 will be discussed in greater detail with reference to FIG. 4. The controlled oscillation module 18 receives the error signal 30 and produces therefrom an oscillating signal, which represents the recovered clock signal. Feedback module 20 and divider 38 generate feedback signal 28 by dividing oscillating signal 36 by a divider value, which may be a whole number equal to or greater than one. Feedback module 20 and divider 38 adjust feedback signal 28 to one-half the data rate of the input data signal.

Figure 2:
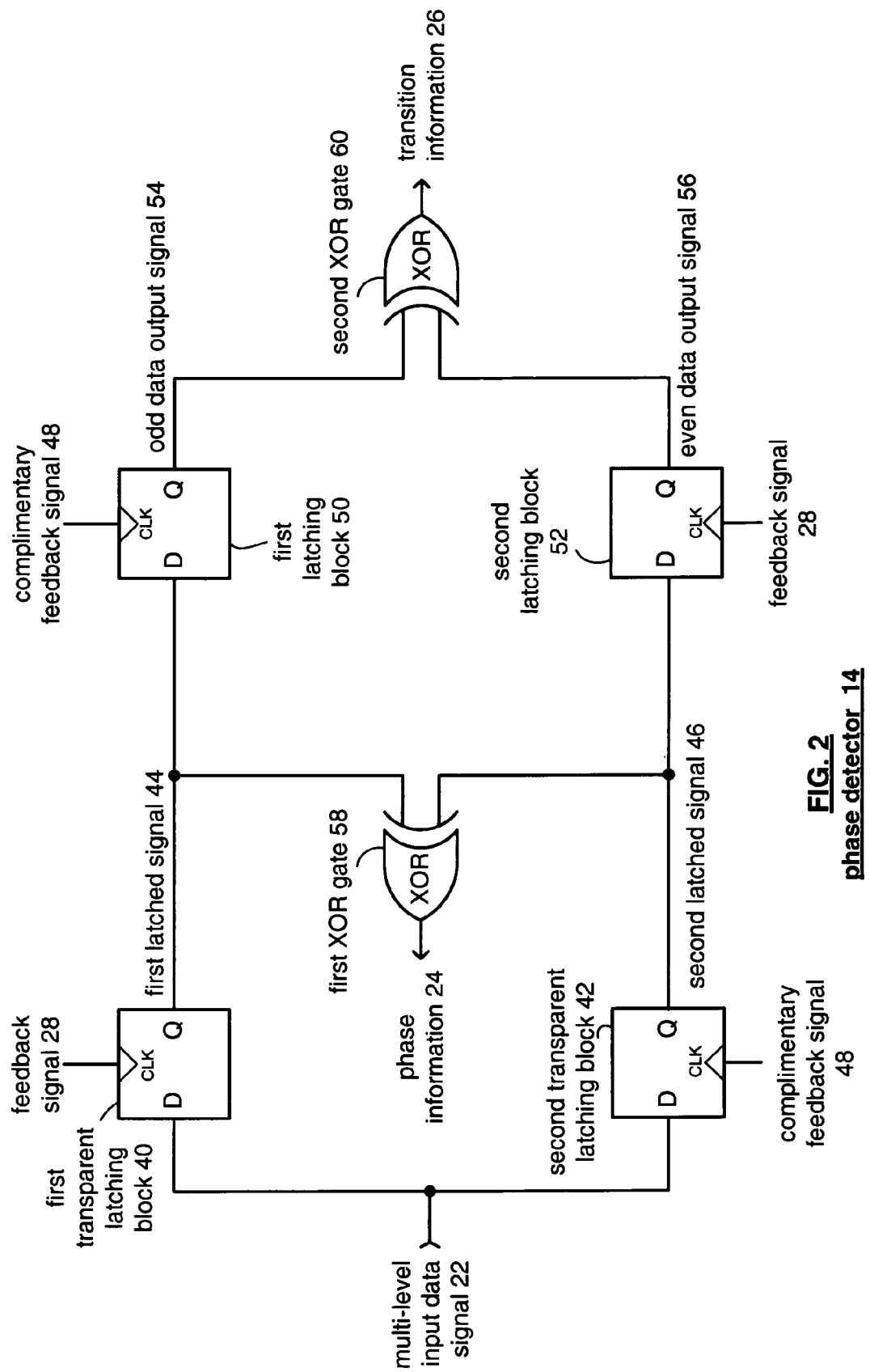
FIG. 2 illustrates a schematic block diagram of a phase detector of the clock recovery circuit of FIG. 1.

FIG. 2 illustrates a schematic block diagram of a phase detector 14 of the clock recovery circuit of FIG. 1. Phase detector 14, operating in a NRZ only mode, functions to produce phase information 24 and transition information 26 based on the relationship between input data signal 22 and feedback signal 28. Generally, phase information 24 reflects a phase relationship of an input signal with respect to the feedback signal while transition information 26 reflects that there has been a logic state change between two successive data bits of the input data. More specifically, phase information 24 is representative of the relative phase difference between input data signal 22 and feedback signal 28. As described previously, the feedback signal is adjusted to one-half the data rate of the input data signal or to another desired fractional rate of the data based on the data recovery scheme.

With the high data rates prevalent in data communications, (e.g., SONET), designing a 5 or greater gigabit per second oscillator is difficult. By using a one-half data rate design and sampling on both the rising and falling edges of the feedback signal, an effective 5 gigabit per second rate is achieved. The data contained in input data signal 22 is essentially random, thus it is just as probable to receive a consecutive series of logic ones or logic zeros as it is to receive an alternating pattern of logic ones and logic zeros. Phase detector 14 produces transition information 26 to indicate a change in logic levels of input data signal 22. Transition information 26 will remain at logic one as long as the input data signal 22 changes states at least once every one-half clock cycle, or 100 picoseconds for the 5 GHz feedback signal of one embodiment in a locked condition where data and clock are 90 degrees out of phase, i.e. sampling in middle the data. The transition information will change to a logic zero when the input data signal logic level remains constant, indicating same level consecutive data bits. When there is not a transition on the data, charge pump 16 uses the transition information to prevent controlled oscillation module 18 from erroneously changing frequency on an average.

Continuing with the description of FIG. 2, the input data signal 22 is coupled to a first transparent latch 40 and a second transparent latch 42 to produce a first latched signal 44 and a second latched signal 46, respectively. As is known by one of average skill in the art, transparent latches couple data on an input terminal D to an output terminal Q as long as a CLK terminal on the latch is at logic one and samples the data on the falling edge of the clock (or vice versa). First latch 40 receives feedback signal 28 at the CLK terminal, while second latch 42 receives a complimentary feedback signal 48 at the CLK terminal. Thus, one latch triggers on a rising edge of the feedback signal while the other effectively triggers on a falling edge of the feedback signal.

The first latched signal 44 and second latched signal 46 are further coupled to first exclusive OR (XOR) gate 58 to produce phase information 24. Due to the quadrature sampling of feedback signals (feedback signal 28 and complimentary feedback signal 48) and the first XOR gate 58, phase information 24 will be proportional to the phase difference between input data signal 22 and feedback signal 28. The output thus reflects how far the transition edge of feedback signal 28 (or complimentary feedback signal 48) is from the center of a data bit. The pulse width of phase information 24, when there is a transition in the input data, will be one-half bit period when the feedback signal is centered on the data bit.

First latched signal 44 and second latched signal 46 are coupled to a first master/slave flip-flop 50 and a second master/slave flip-flop 52, respectively. Operation of a master/slave flip-flop differs from operation of a transparent latch in that data on the input terminal D will be sampled during the transition of the CLK signal then the sampled data is coupled to the output terminal Q during the next alternate transition of the CLK signal. Operation of the latch followed by the master/slave flip-flop clocked by complimentary clock signals (feedback signal 28 and complimentary feedback signal 48) serves to produce an output signal composed of alternate bits in the input data signal (half of the full rate). First master/slave flip-flop 50 will produce an odd data output signal 54 while second mater/slave flip-flop 52 will produce an even data output signal 56. One of average skill in the art will recognize that the choice of even and odd is simply a method to describe the contents of the data signal from an arbitrary point in time and should not be construed to mean the actual logic state of the data.

The odd data output signal 54 and even data output signal 56 are coupled to second XOR gate 60 to produce transition information 26. The transition information is indicative of a change in input data signal 22 logic levels. The phase and transition information, as described herein, will be discussed in more detail with respect to FIG. 3.

Figure 3:
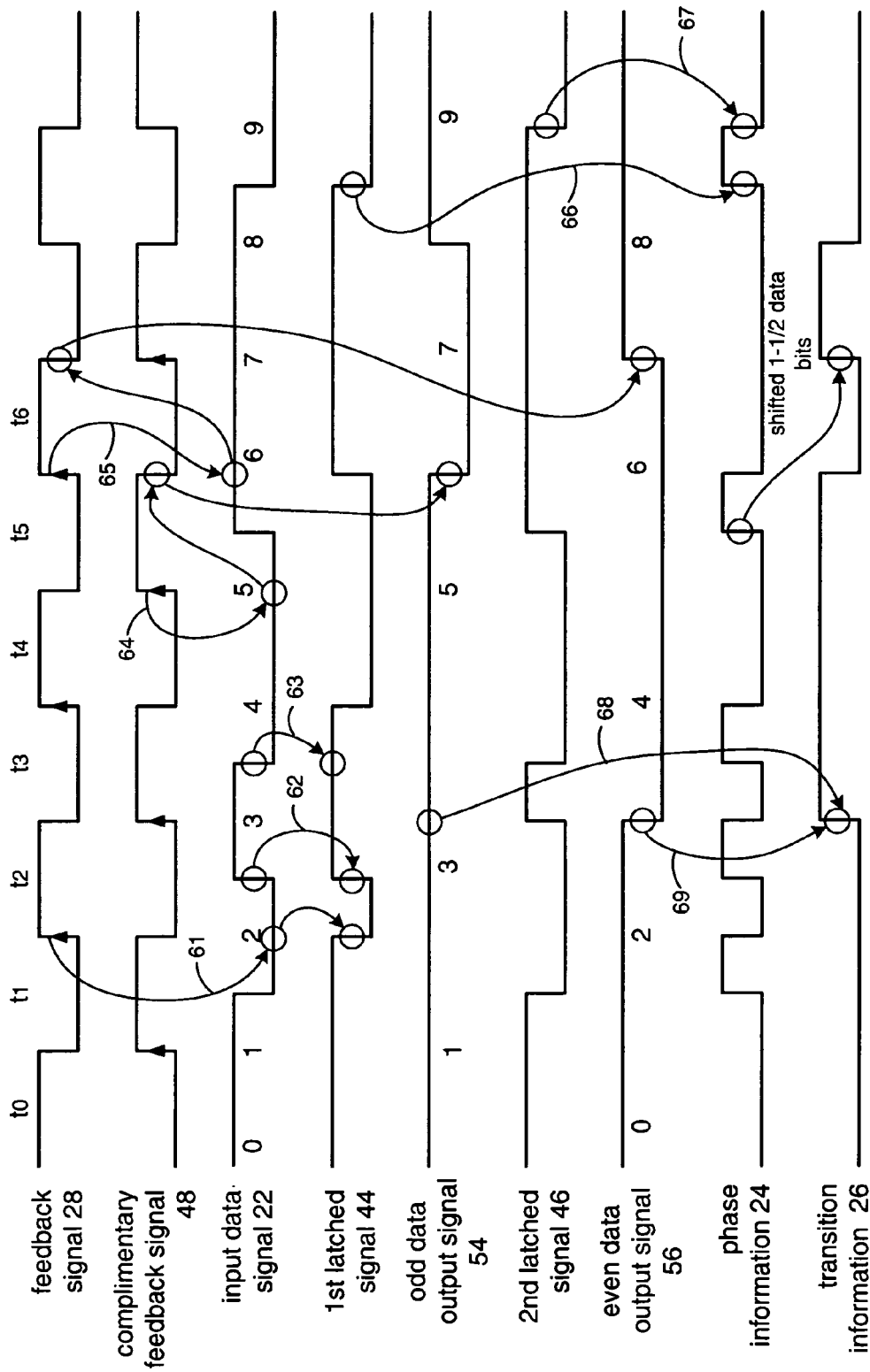
FIG. 3 illustrates a timing diagram for the phase detector of FIG. 2.

FIG. 3 illustrates timing diagrams for the phase detector of FIG. 2. The timing diagrams shown are for single-ended devices to simplify discussion, though one of average skill in the art should recognize that either single-ended or differential signaling may be used. Additionally, the timing diagrams illustrate "perfect" signals with zero rise time, zero fall time, zero propagation delay, and no overshoot or undershoot for exemplary purposes. Additionally, small arrows indicate the sampling edge of feedback signal 28 and complimentary feedback signal 48.

Input data signal 22 comprises a random data bit pattern. The data bits are numbered zero through nine for the purposes of discussion and not intended to convey any information regarding the data. Furthermore, the timing diagrams illustrate phase detector 14 locked to input data signal 22 with feedback signal 28 and complimentary feedback signal 48 transitioning in the center of each data bit. First latched signal 44 follows input data signal 22 during the logic one periods of feedback signal 28, time periods t0, t2, t4, etc. Thus, if input data signal 22 transitions from one level to another, such as the transition during time period t2, first latched signal 44 will follow it as long as feedback signal 28 is logic one. For example, at the rising edge of feedback signal 28 at the start of time period t2 first latched signal 44 transitions to logic zero since input data signal 22 is logic zero. Timing line 61 indicates this sequence. When input data signal 22 transitions to logic one, first latched signal 44 also transitions to logic one as indicated by timing line 62. First latched signal 44 holds the logic one level once feedback signal 28 transitions to logic zero at the end of time period t2. As shown by timing line 63, first latched signal 44 holds the logic one level when input data signal 22 transitions to logic zero. Similarly, second latched signal 46 follows input data signal 22 during logic one periods of complimentary feedback signal 48.

Odd data output signal 54 and even data output signal 56 are produced from first latched signal 44 and second latched signal 46, respectively. First master/slave flip-flop 50 samples first latched signal 44 at terminal D during the transition of complimentary feedback signal 48. The sampled signal is coupled to the output terminal Q during the next transition of complimentary feedback signal 48. Timing line 64 illustrates odd data output signal 54 transitioning to a logic zero as the sampled signal is coupled to the output terminal Q. In a similar manner, second master/slave flip-flop 52 produces even data output signal 56 during alternate transitions of feedback signal 28, as shown by timing line 65. As further shown in FIG. 3, odd data output signal 54 contains data consistent with the odd numbered data bits of input data signal 22, while even data output signal 56 contains data consistent with even number data bits of input data signal 22. The even and odd data output signals can be combined in a serial-to-parallel converter to reconstruct the original data. The operation of the serial-to-parallel converter will be discussed with reference to FIG. 9.

Phase information 24 is produced from first latched signal 44 and second latched signal 46 by first exclusive OR (XOR) gate 58, as shown by timing lines 66 and 67. The width of the pulses will be proportional to the phase difference between the transition of input data signal 22 and the transition of feedback signal 28. The phase detector will adjust the phase of feedback signal 28 to maintain the transitions in the center of input data signal 22, thus, when phase locked, each phase information logic one pulse will be equal to one-half bit period.

Transition information 26 is produced from odd data output signal 54 and even data output signal 56 by second XOR gate 60, as shown by timing lines 68 and 69. Transition information 26 will remain at logic one as long as a data transition is detected once each bit period. Each transition information 26 logic transition is an integer multiple of one bit period and, due to the XOR gate function, will be shifted from phase information 24 pulses by one and one-half bit periods (150 picoseconds at 10 gigabits per second) when phase locked. In an alternate embodiment using latches in place of first master-slave flip-flop 50 and second master-slave flip-flop 52, the transition information is shifted, relative to the phase information, by one-half bit period (50 picoseconds at 10 gigabits per second). The delay insensitive architecture of the preferred embodiment of the present invention does not require phase and transition alignment and can tolerate the timing shift between the phase and transition information.

Figure 4:
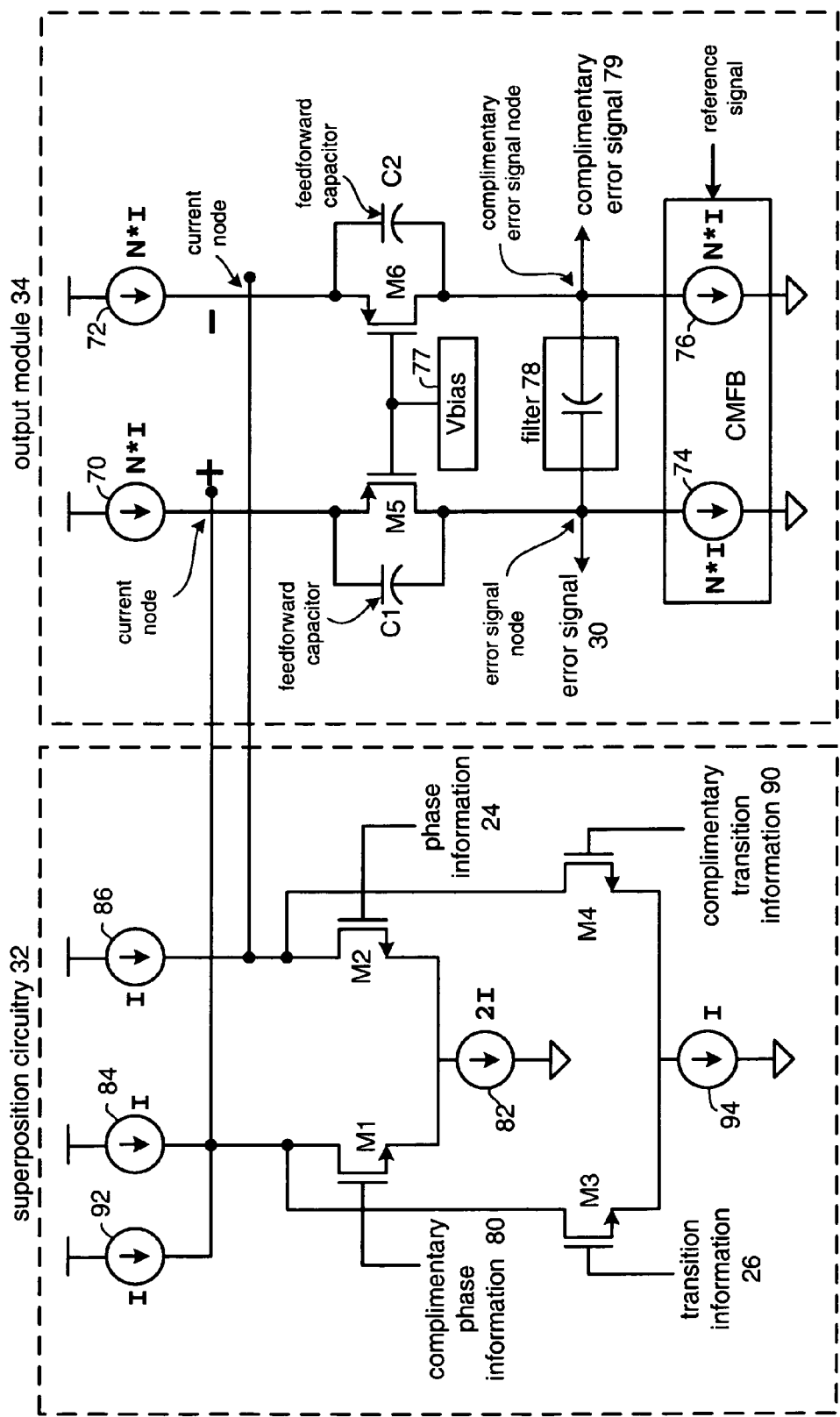
FIG. 4 illustrates a schematic block diagram of a charge pump of the clock recovery circuit of FIG. 1.

FIG. 4 illustrates a schematic block diagram of charge pump 16 of the clock recovery circuit of FIG. 1. Charge pump 16 comprises superposition circuitry 32 and output module 34 coupled to receive phase information 24 and transition information 26 from a phase detector and to generate error signal 30 to an external oscillator module or other device. Superposition circuitry 32 is formed to sink and source current to output module 34 based on the logic levels of phase information 24 and transition information 26.

As shown in FIG. 4, superposition circuitry 32 includes current sources 84 and 92 coupled to output module 34 and to the drain terminals of MOS transistors M1 and M3. Superposition circuitry 32 further includes current source 86 coupled to output module 34 and to the drain terminals of MOS transistors M2 and M4. MOS transistors M1 and M2 have source terminals coupled to current sink 82. The source terminals of MOS transistors M3 and M4 are coupled to current sink 94. The gate terminal of MOS transistor M2 is coupled to receive the phase information 24, while the gate terminal of MOS transistor M1 is coupled to receive the complimentary phase information 80. The gate terminal of MOS transistor M4 is coupled to receive complimentary transition information 90, while the gate terminal of MOS transistor M3 is coupled to receive the transition information 26. As configured, MOS transistors M1-M4 of superposition circuitry 32 will steer current into or out of output module 34 responsive to the phase and transition information. The operation of superposition circuitry will be more fully explained with reference to FIGS. 5-8.

Output module 34 receives and converts superposition circuitry 32 current components into error signal 30 and complimentary error signal 79. A plurality of current sources, namely current sources 70-76 of output module 34, conducts current through bias MOS transistors M5 and M6 to shift the common mode of error signal 30 and complimentary error signal 79 using a reference signal. In general, current sources 70-76 conduct "N" (a whole number) times more current than the "I" current sources of superposition circuitry 32. In the present embodiment, "N" is equal to five.

Current source 70 is connected to the source terminal of bias MOS transistor M5 and to a first terminal of feedforward capacitor C1. The drain terminal of bias MOS transistor M5 and a second terminal of feedforward capacitor C1 are coupled to the error signal node of filter 78 and to current source 74. Similarly, current source 72 is connected to the source terminal of bias MOS transistor M6 and to feedforward capacitor C2. The drain terminal of bias MOS transistor M6 and a second terminal of feedforward capacitor C2 are coupled to the complimentary error signal node of filter 78 and to current source 76. The gate terminals of bias MOS transistors M5 and M6 are coupled to biasing circuitry Vbias 77. Feedforward capacitors C1 and C2, coupled from the source terminals to drain terminals of bias MOS transistors M5 and M6, provide a low impedance path that bypasses most of the high frequency current around bias MOS transistors M5 and M6.

The transfer function zero created by feedforward capacitors C1 and C2 tends to cancel a pole at the positive and negative current nodes. By adding the feedforward capacitors to provide an alternate path for high frequency current components, the charge pump output current is independent of the input data pattern, thus overcoming a problem with the prior art. Filter 78 provides a transimpedance function by charging and discharging in response to the current components of superposition circuitry 32.

The voltage developed across filter 78 is provided as error signal 30 and as complimentary error signal 79 to controlled oscillation module 18 (not shown in FIG. 4). The oscillating frequency of controlled oscillation module 18 will change in response to a change in the error signal voltage thereby changing feedback signal 28 (not shown in FIG. 4) which, in turn, adjusts the phase information produced by phase detector 14 (not shown in FIG. 4). The operation of phase detector 14 was discussed with reference to FIG. 2.

Figure 5:
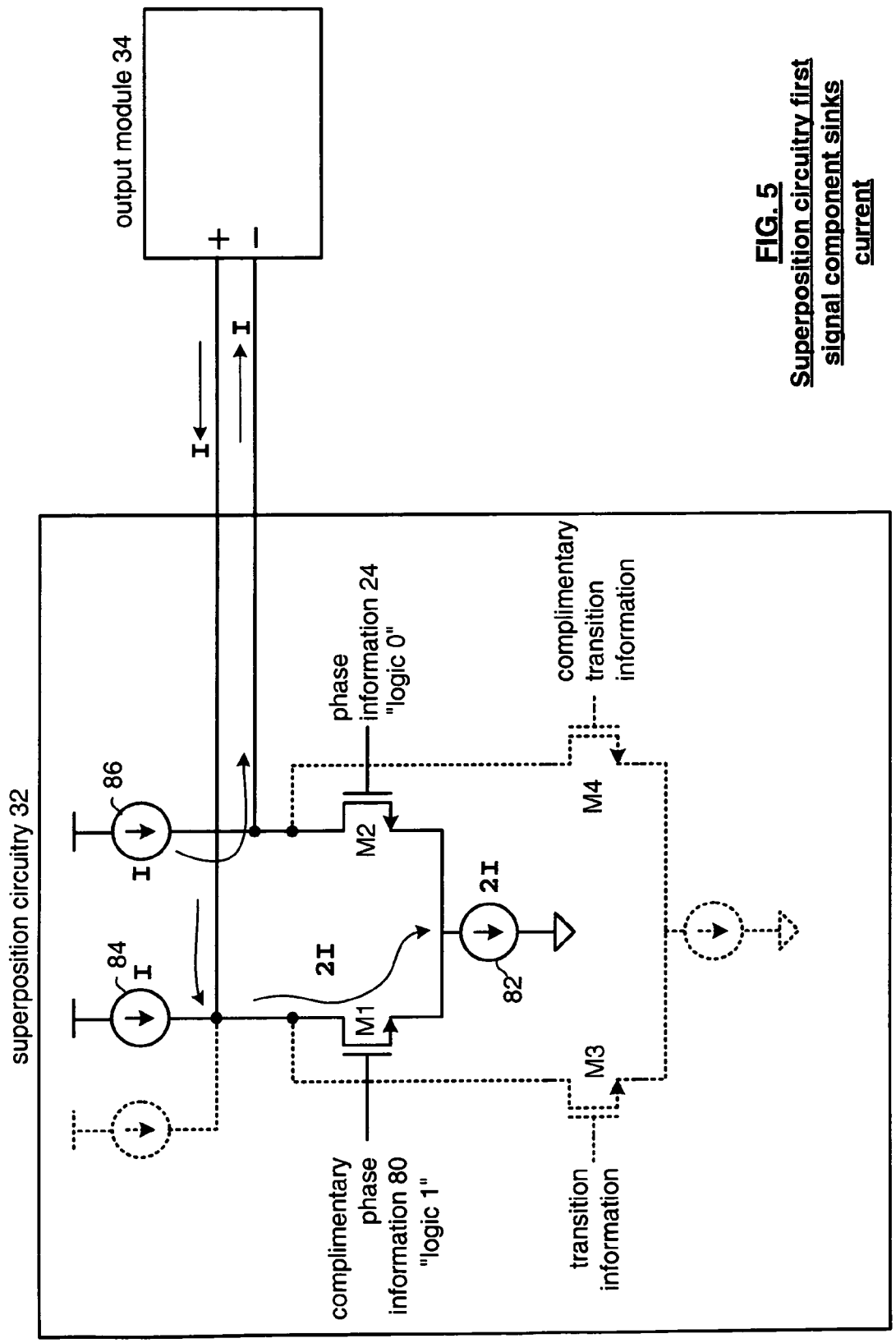
FIG. 5 illustrates the superposition circuitry of the charge pump of FIG. 4 generating a first signal component.

FIG. 5 illustrates the superposition circuitry of the charge pump of FIG. 4 generating a first signal component. As is known by one of average skill in the art, the superposition theorem says that the effects of independent sources in a linear network can be calculated by adding the contribution of each independent source acting alone. The effects of the phase information and transition information on superposition circuitry 32 can be evaluated separately with filter 78 of output module 34 functioning as a summing junction. Continuing with the discussion of FIG. 5, the first signal component is generated when phase information 24 is logic zero and complimentary phase information 80 is logic one. In this mode, the transition circuitry is inactive and shown as dashed lines in FIG. 5. Since phase information 24 is logic zero, MOS transistor M2 is not conducting. MOS transistor M1, by virtue of complimentary phase information 80 being logic one, is conducting a current of 2I to current source (sink) 82. Current source 84 conducts I current so output module 34 must supply the additional I current. In other words, superposition circuitry 32 sinks current from output module 34. Current source 86 conducts current into the negative terminal since this is a differential circuit, though one of average skill in the art should realize the superposition circuitry may be implemented as a single-ended circuit.

Figure 6:
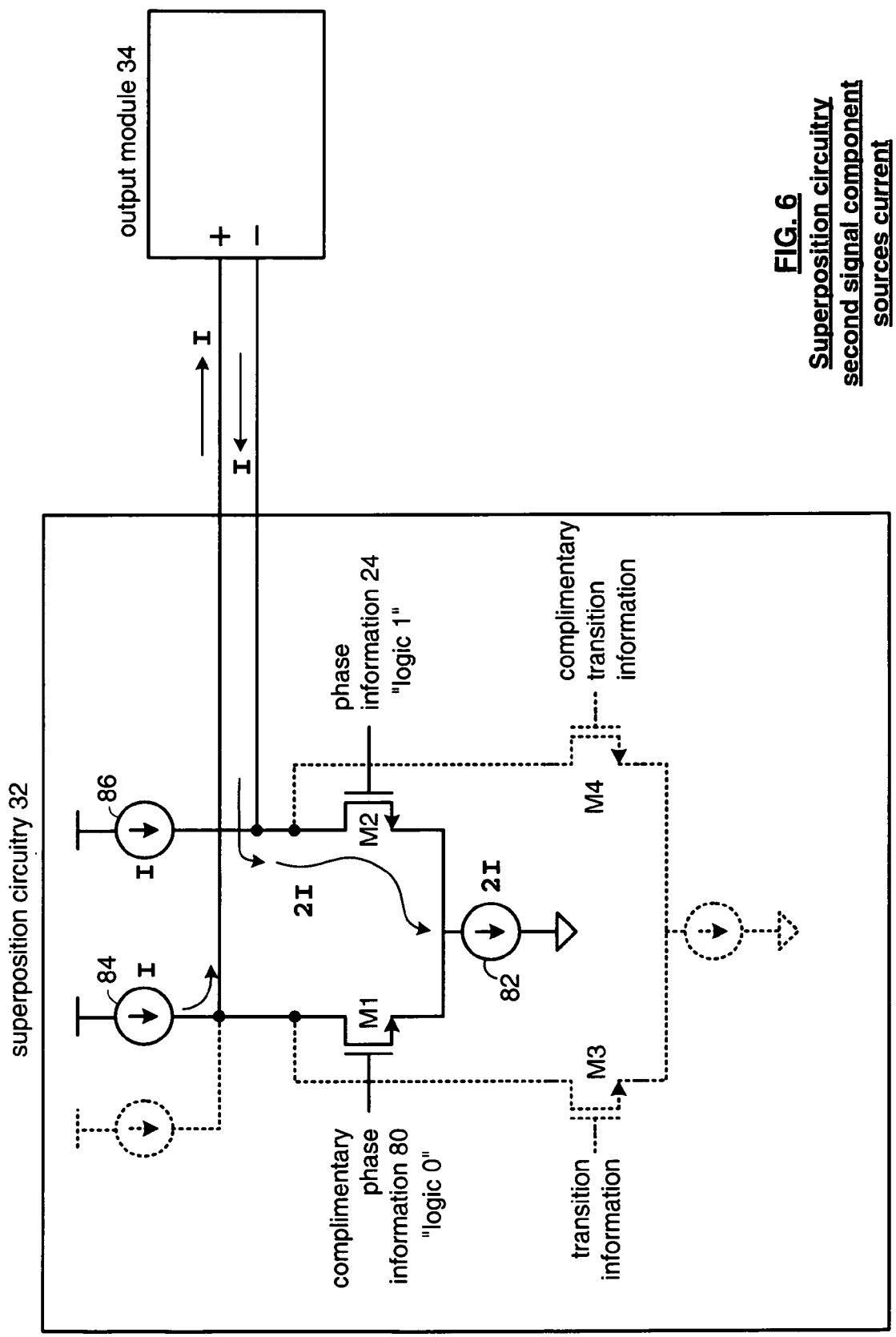
FIG. 6 illustrates the superposition circuitry of the charge pump of FIG. 4 generating a second signal component.

FIG. 6 illustrates the superposition circuitry of the charge pump of FIG. 4 generating a second signal component. Phase information 24 is logic one so complimentary phase information 80 is logic zero. MOS transistor M1 is turned off due to the logic zero coupled to its gate terminal. Current conducted by current source 84 is sourced to output module 34. MOS transistor M2 conducts 2I current due to the logic one applied to its gate terminal. Because current source 86 only supplies I current, the negative terminal of output module 34 supplies I current consistent with the differential operation of this circuit to balance the 2I current generated by current source (sink) 82. In other words, superposition circuitry 32 sources current to output module 34.

Figure 7:
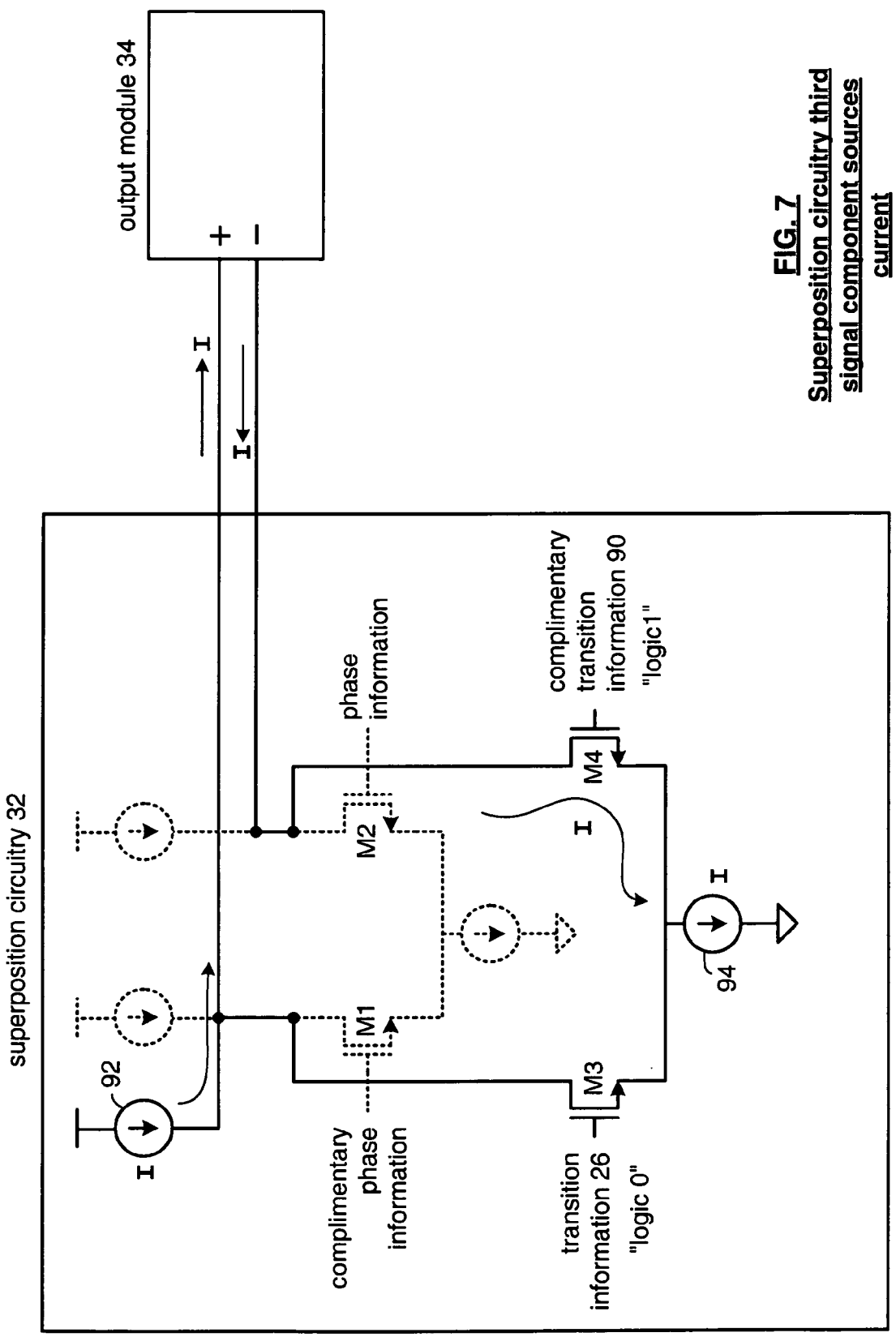
FIG. 7 illustrates the superposition circuitry of the charge pump of FIG. 4 generating a third signal component.

FIG. 7 illustrates the superposition circuitry of the charge pump of FIG. 4 generating a third signal component. In this mode of operation, the transition circuitry is active while the phase circuitry is inactive and therefore shown as dashed lines. Transition information 26 is logic zero while complimentary transition information 90 is logic one. When transition information 26 is logic zero, MOS transistor M3 is off. Current source 92 sources I current to output module 34. MOS transistor M4, turned on by logic one of complimentary transition information 90 coupled to the gate, conducts current I from output module 34 negative terminal to current source 94 coupled to the source terminal. In other words, superposition circuitry 32 sources current to output module 34.

Figure 8:
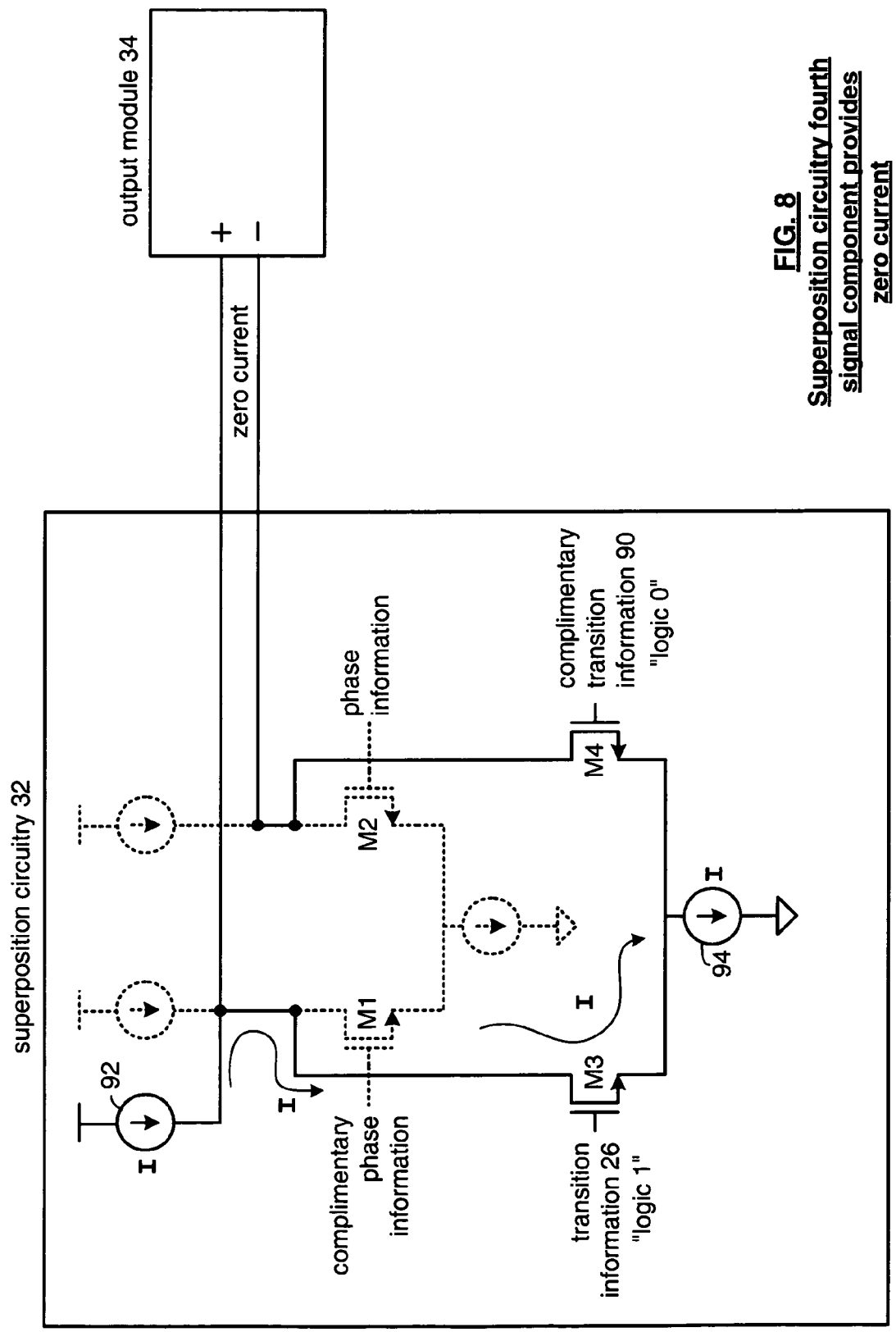
FIG. 8 illustrates the superposition circuitry of the charge pump of FIG. 4 generating a fourth signal component.

FIG. 8 illustrates the superposition circuitry of the charge pump of FIG. 4 generating a fourth signal component. Transition information 26 is at logic, one turning on MOS transistor M3, while complimentary transition information 90 is at logic zero turning off MOS transistor M4. MOS transistor M3 conducts I current supplied by current source 92 so the superposition circuitry provides zero current to output module 34.

In operation, the individual outputs of superposition circuitry 32 combine to produce sinking and sourcing currents to output module 34 responsive to the logic levels of both phase information 24 and transition information 26. Specifically, when transition information 26 is logic one, superposition circuitry 32 will sink "I" current when phase information is logic zero and source "I" current when phase information 24 is logic one. Sinking "I" current from output module 34 removes charge current from filter 78 thereby lowering the voltage developed across filter 78. Conversely, sourcing "I" current to output module 34 increases the voltage developed across filter 78. When transition information 26 is logic zero, superposition circuitry 32 will source "2I" current when phase information 24 is logic one and will provide zero current when phase information 24 is logic zero. The "2I" source current will double the voltage developed across filter 78 as compared to the "I" source current. While it appears that phase information 24 has twice the effect of transition information 26 ("2I" vs. "I"), the pulse width of phase information 24 is, when phase locked, one-half the pulse width of transition information 26, so transition information 26 charges filter 78 for a longer period of time thus producing an equivalent voltage. Because phase information 24 and transition information 26 are not necessarily aligned, superposition circuitry 32 may over charge filter 78 during one period and may under charge during another period. Overtime, however, the average charge will be zero when phase locked. This non-instantaneous response approach allows the inventive circuitry to be delay insensitive. As one of average skill in the art can appreciate, the superposition circuitry 32 may sink or source too much current during one period and may sink or source too little during another period. Over time, however, the average current produced by the superposition circuitry 32 will be zero when phase locked. The inventive superposition circuitry 32 works in conjunction with the inventive phase detector to provide signal delay insensitive operation. As is described herein, the phase and transition signals are not necessarily generated simultaneously by design (50 and 150 picosecond offsets according to described embodiment). The superposition circuitry, by nature of its design, is able to sink or source current independently (i.e., respond to phase and transition signaling independently) to provide frequency and phase error correction. Thus, the preferred embodiment avoids erroneous frequency and phase compensation on average instead of attempting to provide instantaneous frequency and phase error correction thus rendering the overall circuit delay insensitive and overcoming obstacles found in the prior art (No alignment of the phase and transition signal, or post processing of the error signal is required).

Figure 9:
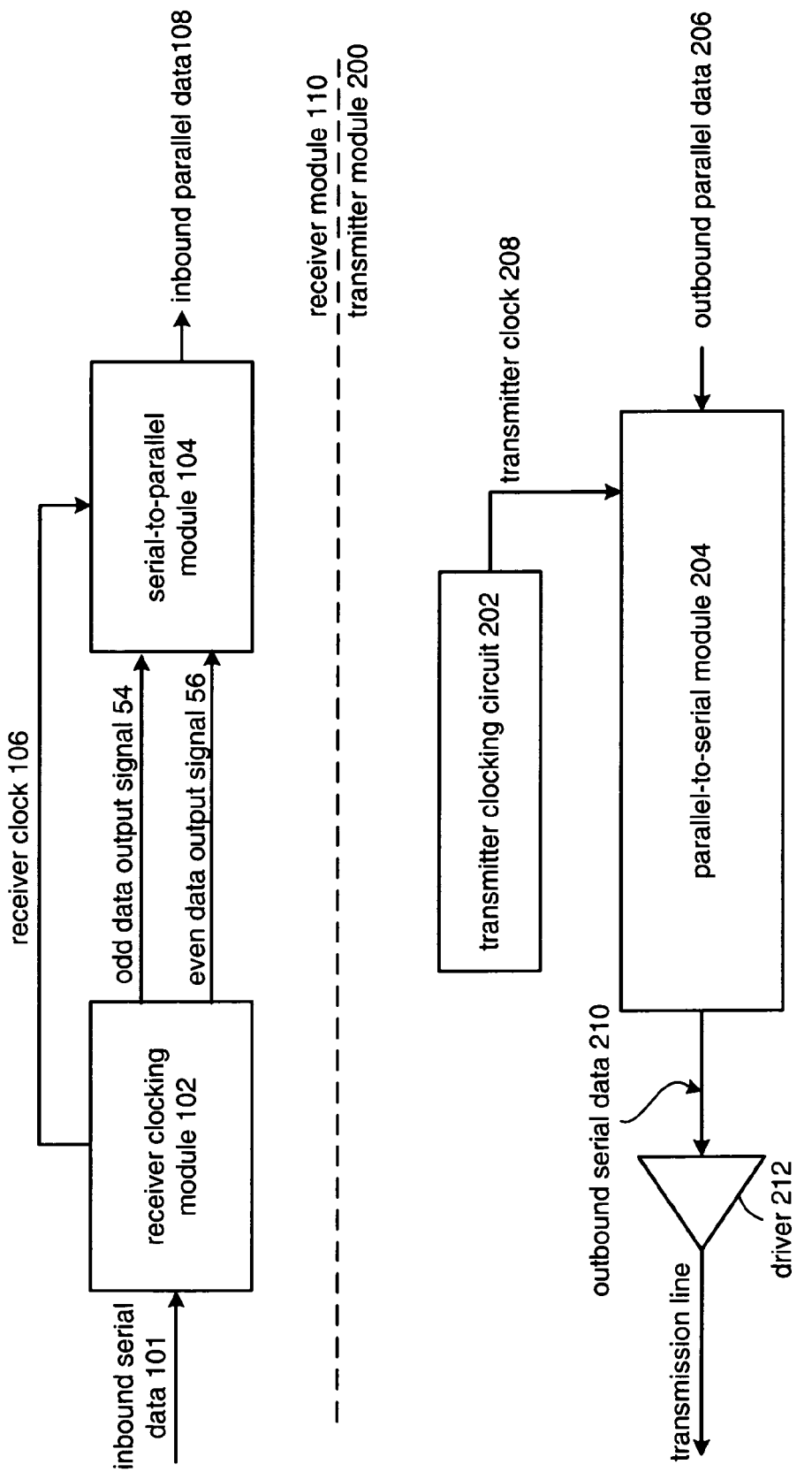
FIG. 9 illustrates a schematic block diagram of a transceiver in accordance with the present invention.

FIG. 9 illustrates a schematic block diagram of a transceiver 100 that includes a receiver module 110 and transmitter module 200. Receiver module 110 includes a receiver clocking module 102 and a serial-to-parallel module 104. Transmitter module 200 includes a transmitter clocking circuit 202, a parallel-to-serial module 204, and a driver 212.

In operation, the receiver module 110 is operably coupled to receive an inbound serial data 101 via the receiver clocking module 102. The receiver clocking module 102, which will be discussed with reference to FIG. 10, generates at least one receiver clock 106. Serial-to-parallel module 104 receives an odd data output signal 54, comprising serial odd data, and an even data output signal 56, comprising serial even data, from receiver clocking module 102 and converts the received serial data into inbound parallel data 108 based on the at least one receiver clock 106. The inbound parallel data 108 is clocked out of serial-to-parallel module 104 at a parallel data rate significantly slower than the at least one receiver clock 106. Accordingly, serial-to-parallel module 104 will divide the at least one receiver clock 106 into a plurality of lower data rate clocks to meet the required parallel data rate. Due to the difference in the serial data rate and the parallel data rate, serial-to-parallel module 104 typically stores the incoming serial data in an internal buffer or similar memory device prior to conversion. As one of average skill in the art will appreciate, the serial input and parallel output may be single-ended or differential signals.

Parallel-to-serial module 204 is operably coupled to receive outbound parallel data 206 and, based on at least one transmitter clock 208, produces outbound serial data 210. Driver 212 contains circuitry to drive a transmission line as well as providing isolation between the parallel-to-serial module 204 and the transmission line. As one of average skill in the art will appreciate, the parallel input and serial output may be single-ended or differential signals. As one of average skill in the art will further appreciate, transmitter clocking circuit 202 may be comprised of clock recovery circuit 10 to generate the transmitter clock 208.

Figure 10:
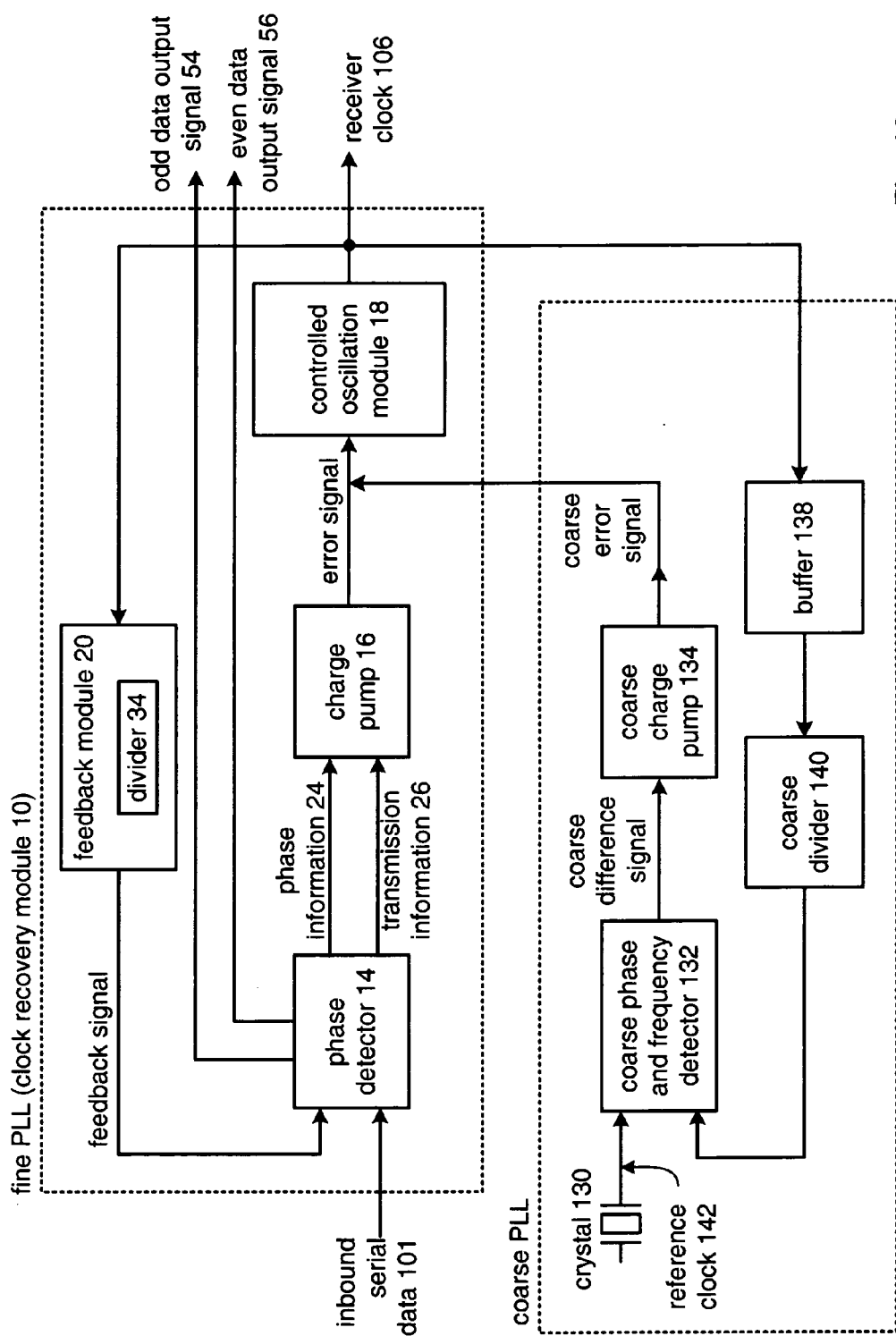
FIG. 10 illustrates a schematic block diagram of a receiver clock recovery module of the transceiver of FIG. 9.

FIG. 10 illustrates a schematic block diagram of receiver clocking module 102 of the transceiver of FIG. 9. The receiver clocking module 102 includes two phase locked loops (PLLs): a coarse PLL and a fine PLL comprising clock recovery module 10. In general, the coarse PLL establishes the desired frequency for the clocking circuit and the fine PLL adjusts the phase of the clock and it will also adjust a limited frequency offset to align it with the incoming data. In the present embodiment of the invention, the feedback signal frequency is one-half the frequency of the incoming data. The coarse PLL includes a crystal 130, a coarse phase and frequency detector 132, a coarse charge pump 134, a buffer 138, and a coarse divider 140. The fine PLL, comprising clock recovery module 10 was described with reference to FIG. 1.

To establish the operating frequency for the clocking circuit, crystal 130 produces a reference clock 142 that is provided to the coarse phase and frequency detector 132. The coarse phase and frequency detector 132 determines the phase and frequency difference between the reference clock 142 and a divided representation of receiver clock 106. The coarse divider 140 provides the divided representation of the receiver clock 106 to the coarse phase and frequency detector 132. Based on the phase and frequency relationship of these signals, coarse phase and frequency detector 132 produces a coarse difference signal. Coarse charge pump 134 receives the coarse difference signal and produces a current representation (which is converted to voltage through the Transimpedance included at the output of the Fine Loop CP) thereof and provides a coarse error signal to controlled oscillation module 18. Controlled oscillation module 18 receives the coarse error signal and, adjusts the oscillation frequency of receiver clock 106. Once the coarse PLL has established the operating frequency, the fine PLL becomes active and adjusts the phase of the receiver clock.

Controlled oscillation module 18 may utilize inductor-capacitor oscillators to produce an output oscillation. By utilizing inductor-capacitor oscillators in comparison to ring oscillators, the noise levels of controlled oscillation module 18 are reduced.

As illustrated, receiver clocking module 102 includes two phase locked loops, one is a fine phase locked loop based on the data and the other is a coarse phase locked loop based on reference clock 142. Such sequential phased locked loop enables the receiver section to readily capture the inbound serial data. As one of average skill in the art will appreciate, receiver clocking module 102 may use single-ended signals or differential signals.

Figure 11:
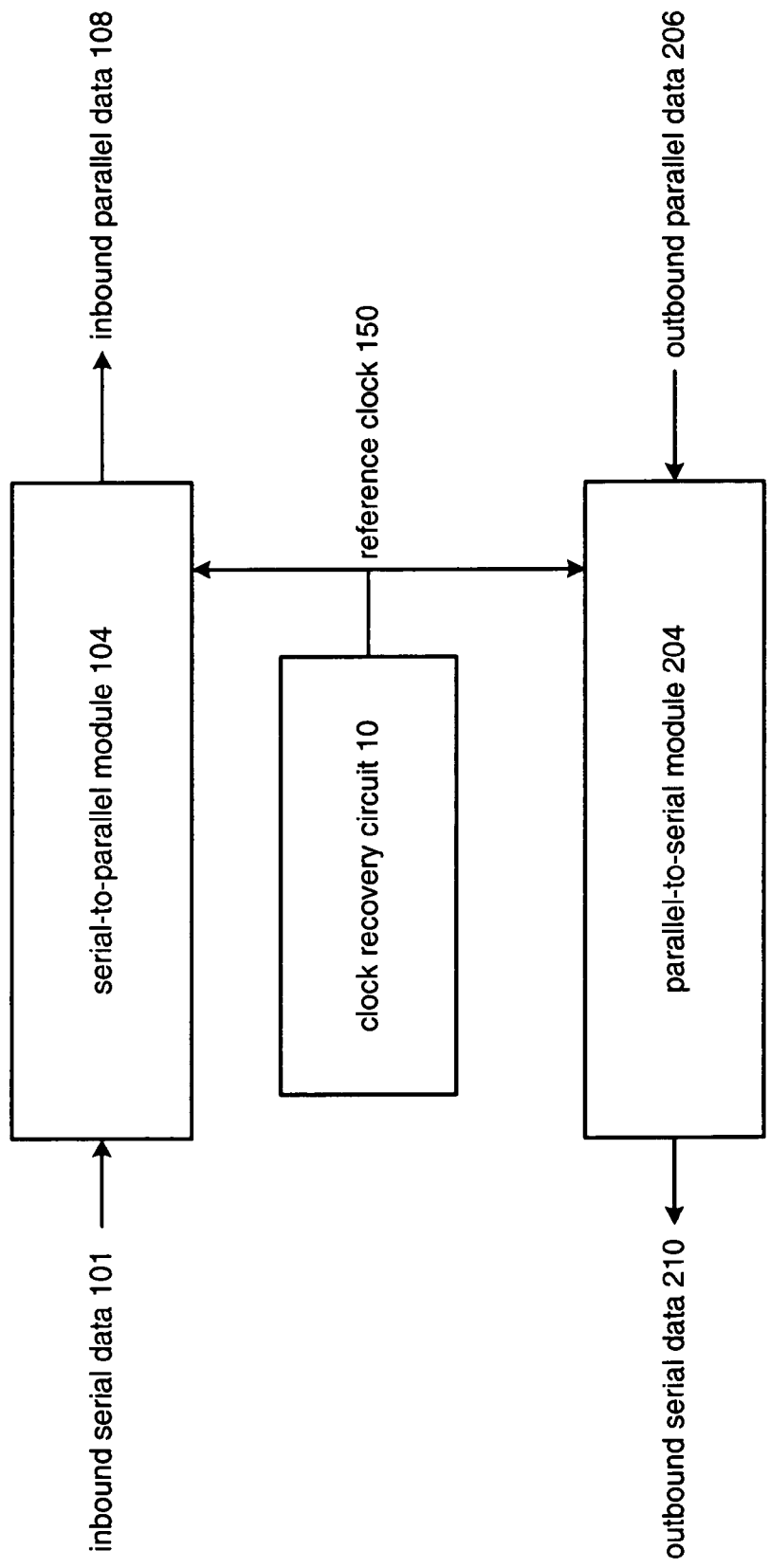
FIG. 11 illustrates an alternate embodiment of the transceiver.

FIG. 11 illustrates an alternate embodiment of transceiver 100 that includes serial-to-parallel module 104, parallel-to-serial module 204, and clock recovery circuit 10. In operation, the clock recovery circuit 10 may be implemented as the transmitter clocking circuit 202 illustrated in FIG. 9 or, a portion thereof, and/or a combination thereof to produce at least one reference clock 150. The at least one reference clock 150 is provided to both the serial-to-parallel module 104 and the parallel-to-serial module 204.

The serial-to-parallel module 104 receives inbound serial data 101 and produces inbound parallel data 108 therefrom. The parallel-to-serial module 204 receives outbound parallel data 206 and produces outbound serial data 210 therefrom.

Figure 12:
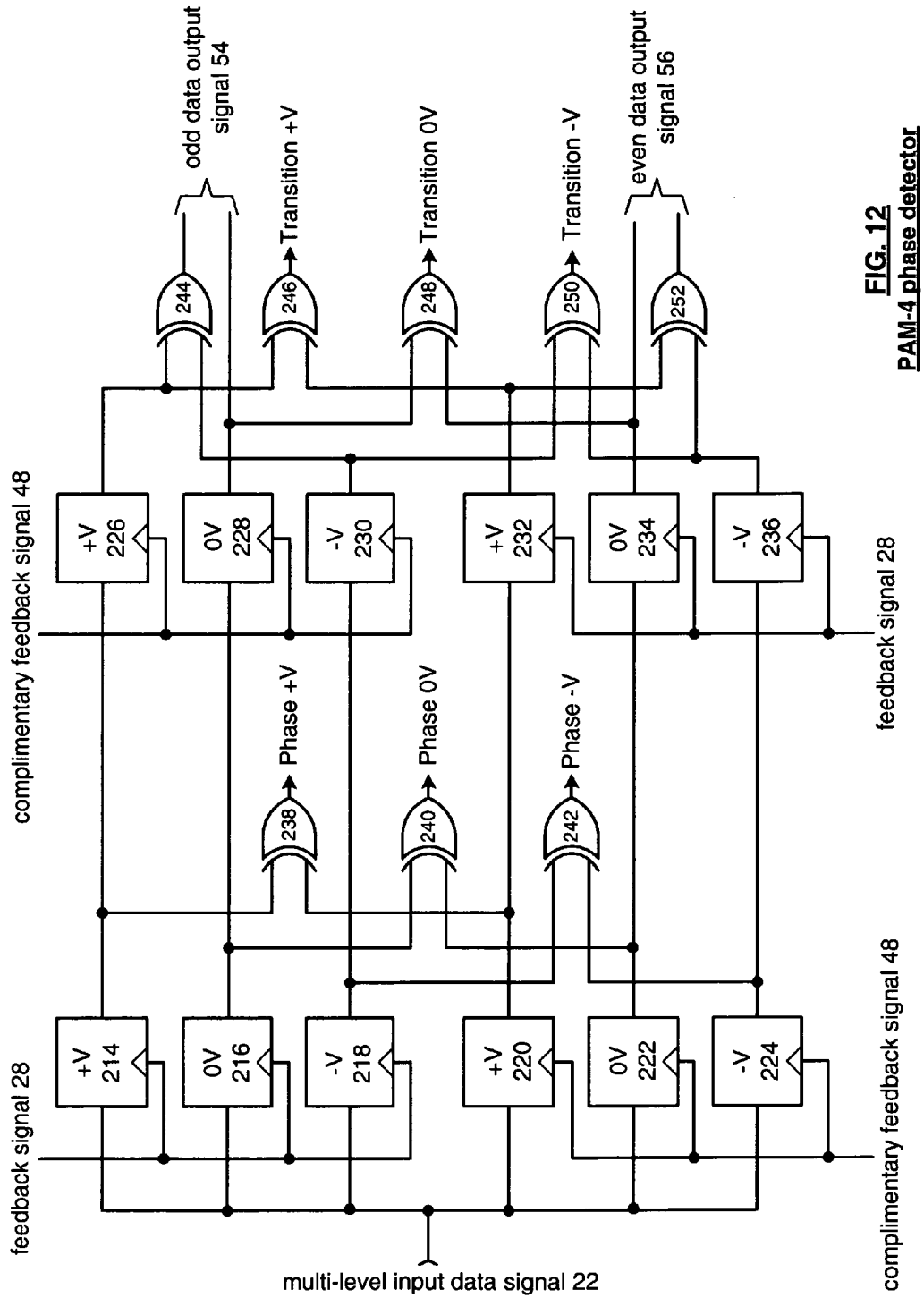
FIG. 12 is a schematic block diagram of a triple mode phase and data detector according to an embodiment of the present invention.

FIG. 12 is a schematic block diagram of a triple mode phase and data detector according to an embodiment of the present invention. As can be seen in FIG. 12, the triple mode phase and data detector includes a plurality of latches and exclusive OR (XOR) gates operably coupled in parallel. Latches 214 through 224 are transparent latched comparators while latches to 226 through 236 are master slave latched comparators, the operation of which is known to one of average skill in the art. By clocking on feedback signal 28 and complimentary feedback signal 48, the circuit of FIG. 12 operates at a clock rate approximately equal to one-half the rate of the multi-level input data signal 22. The half-rate detected data is produced as odd data output signal 54 and even data output signal 56. The triple mode phase and data detector of FIG. 12 effectively represents multiple versions of phase detector 14 of FIG. 2 operably coupled in parallel. The operation of the triple mode phase and data detector of FIG. 12 is consistent with the operation of the phase detector 14 of FIG. 2.

Each of the latched comparators in FIG. 12 are configured to detect multi-level input data signal 22 crossing one of three threshold's namely a +V threshold, a zero V threshold, and a −V threshold, wherein each threshold represents a pre-configured bias level based on a system differential voltage level. For example, if the system differential voltage level is defined as +3 V and −3 V than the threshold's may be defined as +2 V, 0 V, and −2 V. These voltage levels are exemplary and it should be understood that the selection of the threshold voltages is typically selected externally based on system requirements.

In operation, each latched comparator will detect multi-level input data signal 22 crossing through the respective threshold for that latched comparator. The output of each latched comparator will be, therefore, a function of the voltage level of multi-level input data signal 22 and the rising edge of either feedback signal 28 or complementary feedback signal 48. Feedback signal 28 and complimentary feedback signal 48 are produced by clock recovery circuit 10 of FIG. 1. The triple mode phase and data detector as shown in represents a PAM-4 phase detector that detects four voltage thresholds to produce 2 bits of information. Thus, for a fixed bandwidth, the circuit of FIG. 12 of one embodiment of the present invention produces a 2× increase in data throughput.

The detected phase and transition information is produced by triple mode phase and data detector as signals Phase +V, Phase 0V, Phase −V, Transition +V, Transition 0V, and Transition −V. These signals are operably coupled to a charge pump where the phase and transition information is converted to an error signal that adjusts the oscillation frequency of a controlled oscillation module, as is known to one of average skill in the art. Although shown as single ended signaling for the purposes of discussion, it is understood that the signaling may be either single ended or differential and, in the present embodiment, is understood to be differential.

As will be discussed in the following figures, the triple mode phase and data detector of FIG. 12 is able to detect a plurality of modulated signals. For example, by selectively disabling circuit elements of FIG. 12, the phase detector of this embodiment of the present invention will also detect NRZ and PRML encoded data. Another aspect of the embodiment of the present invention illustrated in FIG. 12 is the averaging of early and late signals to maintain feedback signal 28 in the center of multi-level input data signal 22.

Figure 13:
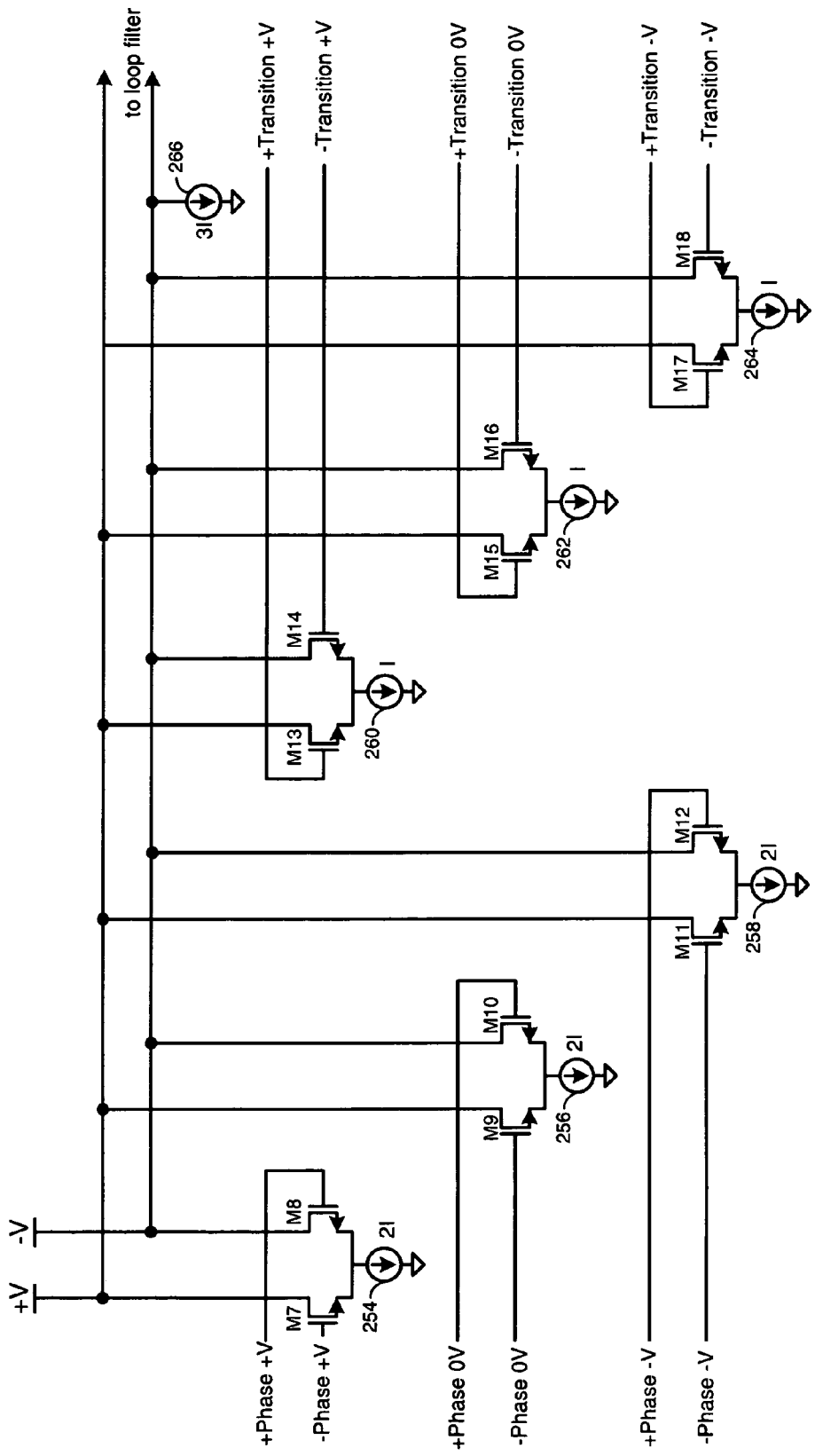
FIG. 13 is a schematic block diagram of a charge pump according to an embodiment of the present invention.

FIG. 13 is a schematic block diagram of a charge pump according to an embodiment of the present invention. The charge pump includes three pairs of differential transconductance amplifiers including transistors M7 through M18 and current sinks 254 through 266. As may be seen in FIG. 13, three differential transistor pairs, transistors M7 through M12, are operably coupled to the received phase information from the phase detector of FIG. 12 while three differential transistor pairs, transistors M13 through M18, are operably coupled to the received transition information from the phase detector of FIG. 12. As is know to one of average skill in the art, the charge pump produces a current signal as an error signal operably coupled to a loop filter (not shown) that converts the error signal produced by the charge pump of FIG. 13 into a voltage signal coupled to a controlled oscillation module.

Each differential pair includes a pair of transistors with sources coupled to a current sink and drains connected to a supply voltage shown as differential supply +V and −V. Each transistor gate of the differential pair is operably coupled to opposite phases of the phase or transition information. For example, differential transistor pair M7 and M8 are operably coupled to received opposite phases of Phase +V, namely +Phase +V and −Phase +V. When +Phase +V is high, −Phase +V is low and transistor M8 conducts a current of 2I to current sink 254. Transistor M7 is turned off by the low −Phase +V. Conversely, when −Phase +V is high, transistor M7 conducts a current of 2I and transistor M8 is turned off. Transistor pairs M9-M1 and M11-M12 operate in a similar manner with Phase 0V and Phase −V, respectively.

Differential transistor pair M13 and M14 are operably coupled to receive opposite phases of Transition +V, namely +Transition +V and −Transition +V, respectively. When +Transition +V is high, −Transition +V is low and transistor M13 conducts a current of I to current sink 260 and transistor M14 is turned off. Conversely, when −Transition +V is high, transistor M14 conducts a current of I while transistor M13 is turned off. Transistor pairs M15-M116 and M17-M18 operate in a similar manner with Transition 0V and Transition −V, respectively.

In operation, as the phase detector produces the phase and transition information based on the detected threshold levels of multi-level input data signal 22, the charge pump of FIG. 13 operably couples varying amounts of current into or out of the loop filter (not shown) to maintain feedback signal 28 substantially centered in the center of the bit period of multi-level input data signal 22. Ideally the transition from one threshold level to another threshold level occurs in the center of the bit period. If the threshold crossing is not precisely centered in the bit period, due to circuit parasitics for example, the parallel design of the phase detector and charge pump produces a corresponding current whose average is equivalent to the current produced by a threshold crossing centered in the middle of the bit period. Stated differently, only if the transition across the −V threshold is not centered then the four −V latches clocked on opposite phases of feedback signal 28 turn on differential pairs M11-M12 and M17-M18 such that the average current produced is substantially equal to that of a transition centered in the bit period.

Figure 14:
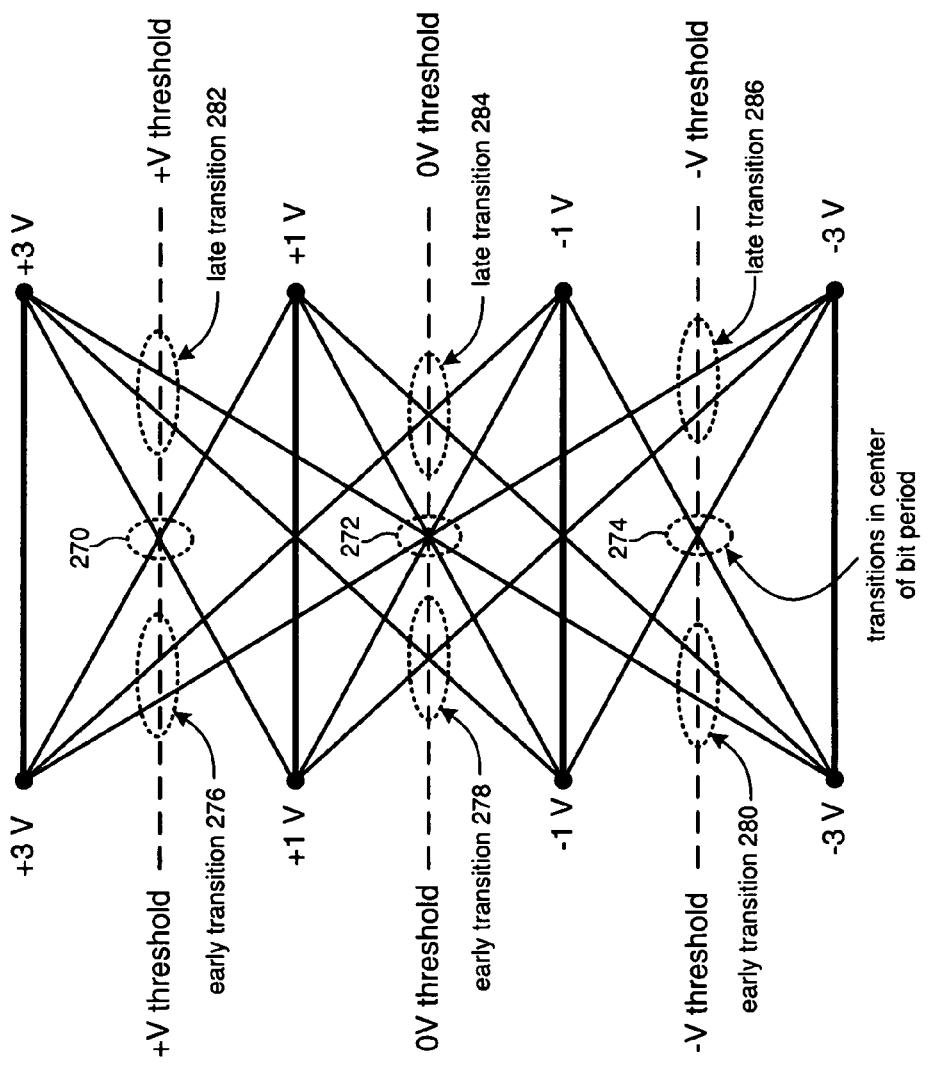
FIG. 14 illustrates all possible transitions of a PAM-4 signal.

FIG. 14 illustrates all possible transitions of a PAM-4 signal. As can be seen in FIG. 14, there are four PAM-4 signal levels and three thresholds that define the threshold separation of the four levels. The exemplary voltage levels of +3, +1, −1, and −3 represent typical levels of a differential PAM-4 signal while the +V and −V thresholds are typically set to the center between the two voltage levels. Thus, in the example of FIG. 14, the +V threshold would be set to +2 volts and the −V threshold would be set to −2V. Each voltage level may transition to one of three levels, thus the 24 lines represent all the possible level transitions. More specifically, the +3 V level can transition to the +1 V level, the −1 V level or the −3V level; the +1 V level can transition to the +3V level, the −1V level or the −3 volt level; the −1V level can transition to the +3V level, the +1 V level or the −3 volt level; and the −3V level can transition to the +3V level, the +1v level and the −1V level.

As can be further seen in FIG. 14, only certain level transitions cross the thresholds levels in the center of the transition bit period. State differently, only transitions to an adjacent level or to a complimentary transition level will cross the threshold level in the center of the transition bit period. For example, the transitions from the +3V level to the +1V level, the +1V level to the −1V level, and the −1V level to the −3V level each cross a threshold in the center of the transition bit period. Similarly, the transition from the +3V level to the −3V level, the −3V level to the +3V level, and transitions between +/−1V levels cross thresholds in the center of the transition bit period. All other transitions produce phase information pulses that are too long or too short thus appearing as if the clock arrived too early or too late, respectively. For example, transitions 270, 272, and 274 are in the center of the transition bit period, while transitions 276-280 are too early and transitions 282-286 are too late. However, due to the parallel configuration of the described embodiment of the present invention, each early pulse (or each late pulse) has a corresponding late pulse (or early pulse). Both pulses are early and late by the same amount so that, over time, they average out and the net effect is the phase information pulse appearing in the center of the transition bit period.

Figure 15:
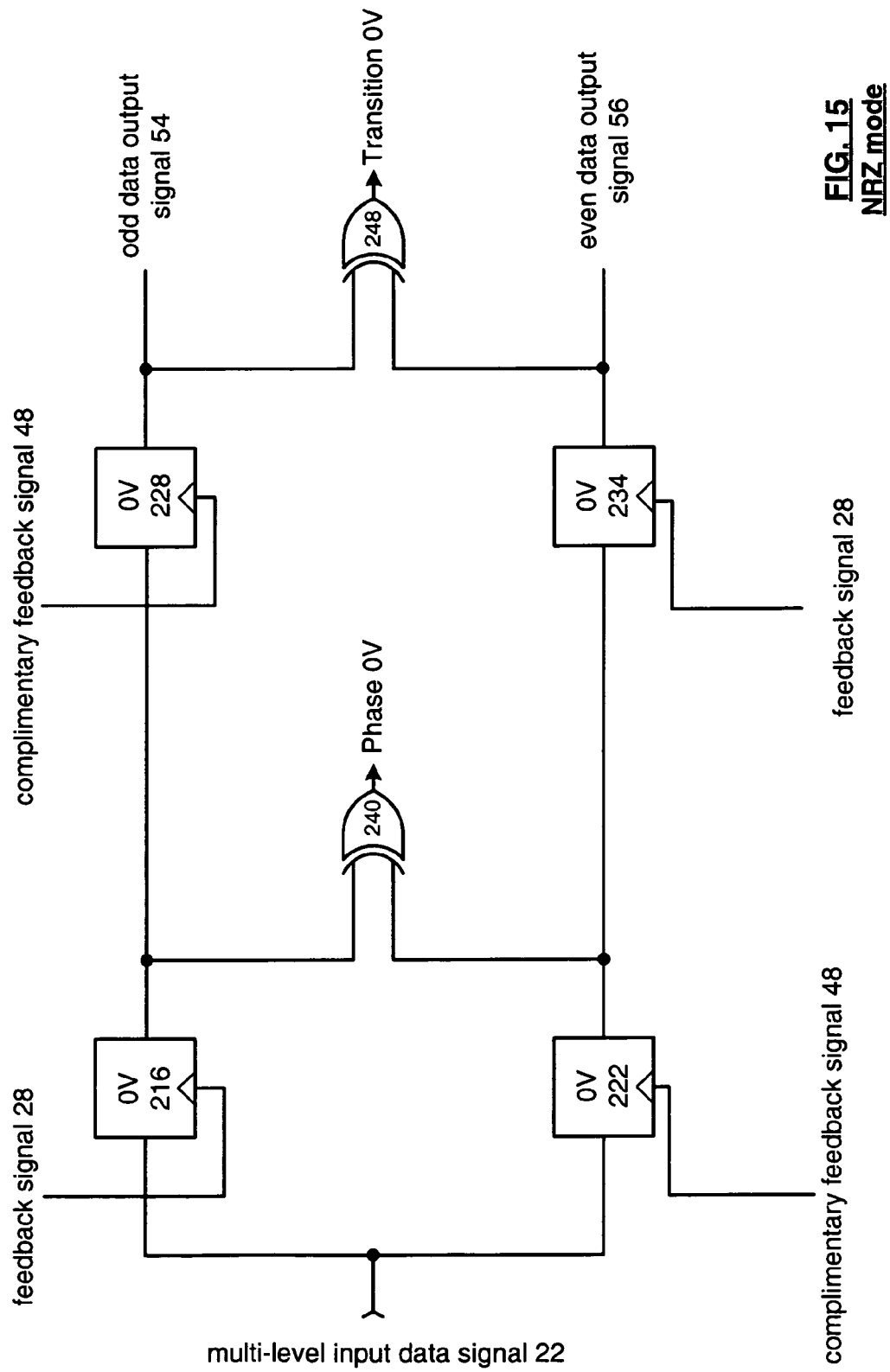
FIG. 15 is a schematic block diagram of a NRZ phase detector in accordance with an embodiment of the present invention.

FIG. 15 is a schematic block diagram of a NRZ phase detector in accordance with an embodiment of the present invention. As is known to one of average skill in the art, NRZ data is a two level PAM signal. One embodiment of the present invention provides a triple-mode data and phase detector by allowing external circuitry to selectively enable and disable circuit elements in order to configure the data and phase detector for one of three modes of operation. If the incoming signal is modulated as a NRZ signal, the external circuitry selectively disables the latches and XOR gates associated with the +V and −V thresholds leaving the active circuitry shown in FIG. 15. The phase detector of FIG. 15 is functionally equivalent to the phase detector of FIG. 2.

Figure 16:
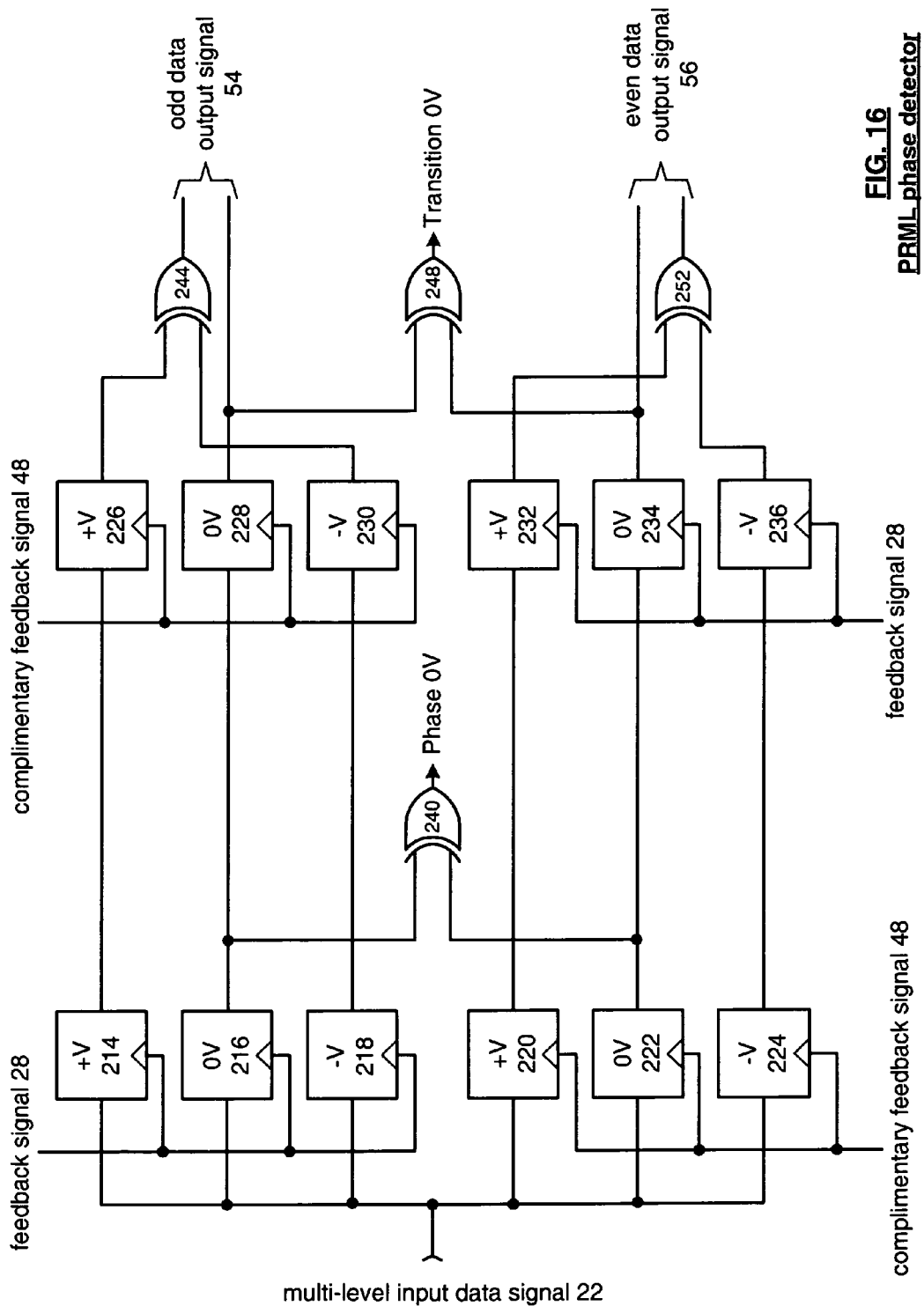
FIG. 16 is a schematic block diagram of a PRML phase detector in accordance with an embodiment of the present invention.

FIG. 16 is a schematic block diagram of a PRML phase detector in accordance with an embodiment of the present invention. When a NRZ signal is transmitted over a bandwidth limited transmission medium, the signals may be too attenuated to cross the 0V threshold of a typical NRZ phase detector. In this situation, an embodiment of the present invention is operable to detect the reception of the attenuated signals, commonly called weak ones and weak zeros, by selective disabling of circuit elements to produce the PRML phase detector of FIG. 16. Additionally, external circuitry may adjust the +V and −V threshold levels based on the severity of the attenuation. The concept of weak ones and weak zeros is generally understood by one of average skill in the art.

In FIG. 16, the XOR gates associated with the +V and −V latches have been disabled by external control logic (not shown) leaving the six latches and XOR gates 240, 244, 248, and 252 operational. Although not shown, the charge pumps associated with the +V and −V latched comparators will also be disable. The threshold levels of the +V and −V latched comparators are set to a mid point between the 0V threshold and the voltage levels representing a logical one and a logical zero, respectively, in the transceiver circuitry. In this configuration, a logic one transmitted over the attenuated medium will transition from a strong zero to some level that is less than the 0V threshold (a weak zero) then fall back to the strong zero level. Since the attenuated signal never crosses the 0V threshold, the transition is not detected. The embodiment of FIG. 16 detects the double crossing of the −V threshold due to the active −V latched comparators and produces a three-bit output signal (010). Similarly, a logic zero transition transmitted over the bandwidth limited medium may transition from a logic one (a strong one) to some level that is greater than the 0V threshold (a weak one) and then rise back to the logic one level (a strong one). The three-bit pattern of strong one, weak one, and strong one (101) is detected by the PRML phase detector of FIG. 16. By decoding the three-bit pattern of strong ones, weak ones, strong zeros, weak zeros, this embodiment of the present invention is operable to detect PRML data.

Figure 17:
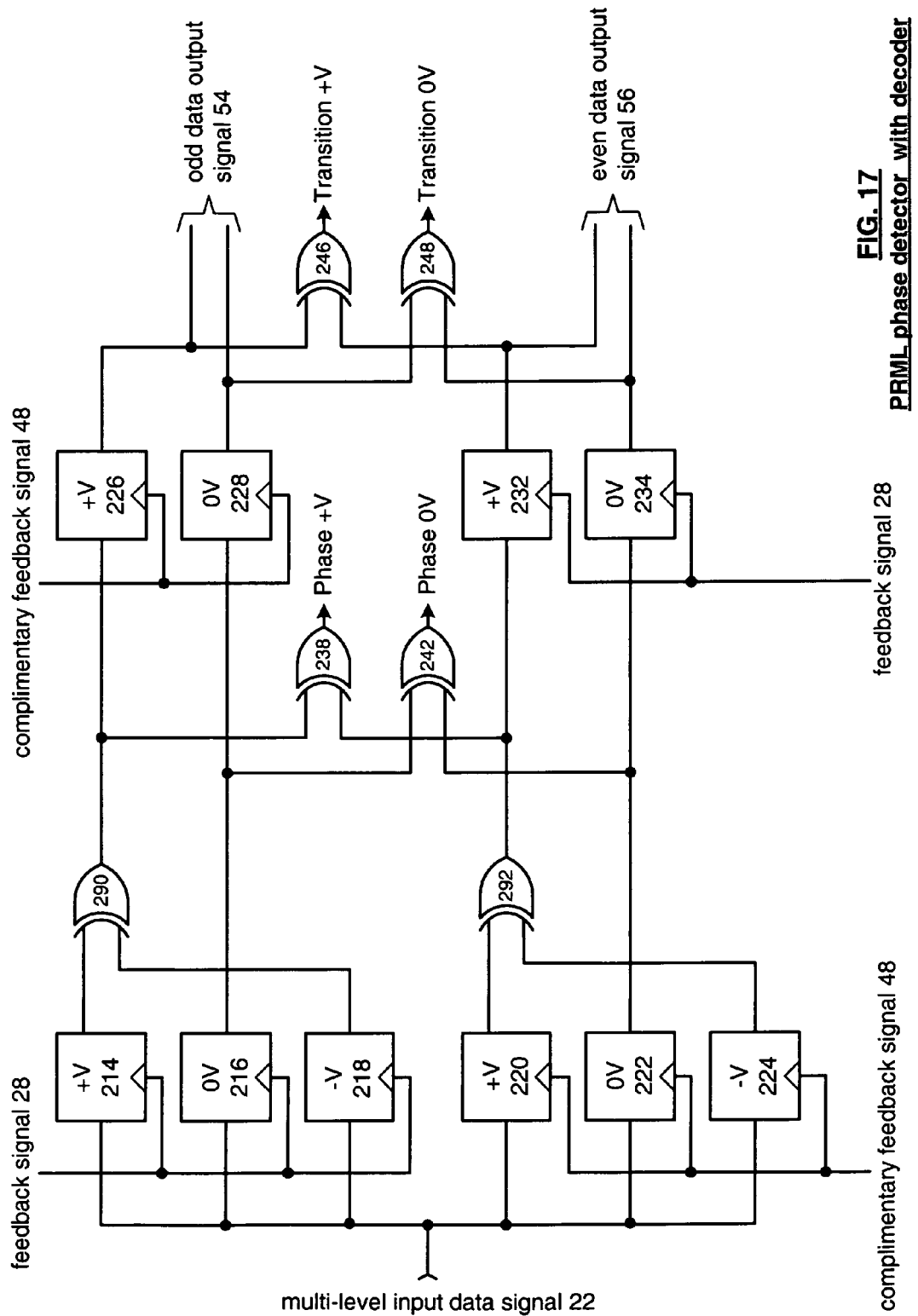
FIG. 17 is a schematic block diagram of a PRML phase detector with decoder according to an embodiment of the present invention.

FIG. 17 is a schematic block diagram of a PRML phase detector with decoder according to an embodiment of the present invention. The decoder of FIG. 17 is the PRML phase detector of FIG. 16 enhanced with additional XOR gates 290 and 292 to decode the 3-bit thermometer code produced by the PRML phase detector into 2 bits. As may be seen, the outputs of latched comparators 214 and 218 are operably coupled to XOR gate 290 to operably couple the weak/strong threshold crossings to the +V latched comparator 226. When combined with the 0V latched comparator, the two signals form the single bit differential odd data output signal 54. The outputs of latched comparators 220 and 224 are operably coupled to XOR gate 292 to produce single bit differential even data output signal 56.

FIG. 18 is a flow chart of a phase detector method according to an embodiment of the present invention. The method latches a multi-level input data signal based on a feedback signal to produce a first latched signal (step 300). The feedback signal produced by a controlled oscillation module whose output is based on the recovered clock produced by the phase detector. The phase detector is a half rate architecture and, accordingly, latches the first latched signal based on a complimentary feedback signal to produce an odd data output signal (step 302). The complimentary feedback signal is an out of phase representation of the feedback signal and is typically achieved by designing latches to trigger on the falling edge of the feedback signal as well as the rising edge.

The method thereafter latches the multi-level input data signal based on the complimentary feedback signal to produce a second latched signal (step 304) and latches the second latched signal based on the feedback signal to produce an even data output signal (step 306). As is know by one of average skill in the art, the description of even and odd data simply indicates each half of the phase detector recovers alternate data bits from the multi-level input data signal. The method also latches the multi-level input data signal with a plurality of latching blocks clocked by one of the feedback signal and the complimentary feedback signal (step 308). In order to latch the multi-level input data signal, the method also selectively biases each of the plurality of latching blocks to a plurality of biasing levels (step 310). These levels are externally selected to produce a series of desired threshold levels based on the system architecture such as single ended or differential and the supply voltage.

In order to recover clock and data form the multi-level input data signal, the method combines the first latched signal, second latched signal, odd data output signal, and even data output signal in logic to produce a plurality of phase information signals and transition information signals (step 312). The phase and transition information functions to adjust the feedback signal to an approximate center of the multi-level input data signal bit period. The method continues by selectively coupling at least one of the plurality of phase information signals and at least one of the transition information signals by selectively activating and deactivating at least one of a plurality of exclusive OR gates (step 314) and selectively activating and deactivating at least one of a plurality of latched comparators (step 316). By selectively activating and deactivating circuit elements, the method of the present invention configures the phase detector to adapt to a plurality of transmitted signal methods. The method further selectively couples at least one of the plurality of phase information signals and at least one of the transition information signals to define a mode of operation of the multi-mode phase and data detector (step 318) wherein the mode of operation includes at least one of a PAM-4, a NRZ, and a PRML mode of operation.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the claims.

What is claimed is:

1. A multi-mode phase and data detector, comprising:
   phase detector operably coupled to produce phase information and transition information based on a feedback signal and a multi-level input data signal, the phase detector further including:
   first transparent latching block operably coupled to latch the multi-level input data signal based on the feedback signal to produce a first latched signal and operably coupled to latch the multi-level input data signal based on the feedback signal;
   first latching block operably coupled to latch the first latched signal based on a complimentary feedback signal to produce an odd data output signal;
   second transparent latching block operably coupled to latch the multi-level input data signal based on the complimentary feedback signal to produce a second latched signal and operably coupled to latch the multi-level input data signal based on the complementary feedback signal;
   second latching block operably coupled to latch the second latched signal based on the feedback signal to produce an even data output signal;
   first logic operably coupled to the first latched signal and second latched signal to produce the phase information; and
   second logic operably coupled to the odd data output signal and the even data output signal to produce the transition information;
   charge pump block operably coupled to generate an error signal based on the phase information and the transition information;
   controlled oscillation module operably coupled to convert the error signal into an oscillating signal; and
   feedback module operably coupled to generate the feedback signal based on the oscillating signal and a divider value, wherein each of the first and second transparent latching blocks produce the first and second latched signals, respectively, and further wherein each of the first and second transparent latching blocks comprises a plurality of parallel coupled latched comparators each biased to one of a plurality of bias levels.

2. The multi-mode phase and data detector of claim 1 wherein the first and second logic comprise two sets of exclusive OR gates coupled to receive outputs from the first and second transparent latching blocks and first and second latching blocks, respectively, to produce phase and transition information based upon the multilevel input data signal.

3. The multi-mode phase and data detector of claim 1 wherein each set of exclusive OR gates comprises three exclusive OR gates each coupled to receive an output of similarly biased latched comparators of the first and second transparent latching blocks and first and second latching blocks.

4. The multi-mode phase and data detector of claim 3 wherein the first and second logic select a set of latched comparators from the plurality of parallel coupled latches to define a mode of operation of the multi-mode phase and data detector.

5. The multi-mode phase and data detector of claim 1 wherein the charge pump block comprises three pairs of differential transconductance amplifiers wherein each pair is coupled to a corresponding set of exclusive OR gates, respectively, of the sets of exclusive OR gates.

6. The multi-mode phase and data detector of claim 1 further comprising logic for selecting a first subset of the sets of exclusive OR gates to place the multi-mode phase and data detector into a NRZ multi-level phase detector mode of operation.

7. The multi-mode phase and data detector of claim 1 further comprising logic for selecting a second subset of the sets of exclusive OR gates to place the multi-mode phase and data detector into a PRML mode of operation.

8. The multi-mode phase and data detector of claim 2 wherein a third subset of the sets of exclusive OR gates consists of all of the exclusive OR gates and further wherein the multi-mode phase and data detector is operable to process PAM-4 modulated data.

9. A method in a multi-mode phase and data detector, comprising:
   latching a multi-level input data signal based on a feedback signal to produce a first latched signal;
   latching the first latched signal based on a complimentary feedback signal to produce an odd data output signal;
   latching the multi-level input data signal based on the complimentary feedback signal to produce a second latched signal;
   latching the second latched signal based on the feedback signal to produce an even data output signal; and
   combining the first latched signal, second latched signal, odd data output signal, and even data output signal to produce a plurality of phase information signals and transition information signals; and wherein
   producing the plurality of phase information signals and transition information signals further comprises selectively coupling at least one of the plurality of phase information signals and at least one of the transition information signals to define a mode of operation of the multi-mode phase and data detector.

10. The method of claim 9 wherein latching the multi-level input data signal further comprises latching the multi-level input data signal with a plurality of latching blocks clocked by one of the feedback signal and the complimentary feedback signal.

11. The method of claim 10 further including selectively coupling at least one of the plurality of phase information signals and at least one of the transition information signals by selectively activating and deactivating at least one of a plurality of exclusive OR gates.

12. The method of claim 11 wherein selectively coupling at least one of the plurality of phase information signals and at least one of the transition information signals by selectively activating and deactivating at least one of a plurality of latched comparators.

13. The method of claim 12 wherein latching the multi-level input data signal further comprises selectively biasing each of the plurality of latching blocks to a plurality of biasing level.

14. The method of claim 9 wherein the defined mode of operation of the includes at least one of a PAM-4, a NRZ, and a PRML mode of operation.

15. A multi-mode phase and data detector, comprising:
first logic for latching a multi-level input data signal based on a feedback signal, wherein the first logic is operable to produce a first latched signal;
second logic for latching the first latched signal based on a complimentary feedback signal, wherein the second logic is operable to produce an odd data output signal;
third logic for latching the multi-level input data signal based on the complimentary feedback signal, wherein the third logic is operable to produce a second latched signal;
fourth logic for latching the second latched signal based on the feedback signal, wherein the fourth logic is operable to produce an even data output signal; and
fifth logic operable to combine the first latched signal, second latched signal, odd data output signal, and even data output signal to produce a plurality of phase information signals and transition information signals.

16. The multi-mode phase and data detector of claim 15 wherein the fifth logic is operable to produce the plurality of phase information signals and transition information signals and to selectively couple at least one of the plurality of phase information signals and at least one of the transition information signals to define a mode of operation of the multi-mode phase and data detector.

17. The multi-mode phase and data detector of claim 16 further including latching blocks clocked by one of the feedback signal and the complimentary feedback signal.

18. The multi-mode phase and data detector of claim 16 further including a plurality of latched comparators operable to detect a signal level according to whether the multi-mode phase and data detector is operating in at least one of a PAM-4, a NRZ, and a PRML mode of operation.

* * * * *